(12) United States Patent
Sakurayama

(10) Patent No.: US 11,432,443 B2
(45) Date of Patent: Aug. 30, 2022

(54) MAINTENANCE BOARD

(71) Applicant: FUJI CORPORATION, Chiryu (JP)

(72) Inventor: Takeshi Sakurayama, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 504 days.

(21) Appl. No.: 16/478,015

(22) PCT Filed: Jan. 17, 2017

(86) PCT No.: PCT/JP2017/001344
§ 371 (c)(1),
(2) Date: Jul. 15, 2019

(87) PCT Pub. No.: WO2018/134867
PCT Pub. Date: Jul. 26, 2018

(65) Prior Publication Data
US 2019/0335630 A1    Oct. 31, 2019

(51) Int. Cl.
*H05K 13/00* (2006.01)
(52) U.S. Cl.
CPC ............ *H05K 13/0069* (2013.01); *H05K 2201/10151* (2013.01); *H05K 2203/0257* (2013.01); *H05K 2203/0763* (2013.01)
(58) Field of Classification Search
CPC .... H05K 13/00; H05K 13/0069; H05K 13/04; H05K 13/0895; H05K 2201/10151; H05K 2203/0257; H05K 2203/0763
See application file for complete search history.

(56) References Cited

U.S. PATENT DOCUMENTS

| | | | |
|---|---|---|---|
| 10,996,661 B2 * | 5/2021 | Oyama | G05B 19/41865 |
| 2017/0227199 A1 * | 8/2017 | Sugihara | G06T 7/001 |
| 2019/0335630 A1 * | 10/2019 | Sakurayama | H05K 13/04 |

FOREIGN PATENT DOCUMENTS

| | | |
|---|---|---|
| CN | 103391707 A | 11/2013 |
| CN | 103706596 A | 4/2014 |
| JP | 2003-179399 A | 6/2003 |
| JP | 2012-156433 A | 8/2012 |
| JP | 2012-204448 A | 10/2012 |
| JP | 2015-220294 A | 12/2015 |

OTHER PUBLICATIONS

International Search Report dated Apr. 18, 2017 in PCT/JP2017/001344 filed on Jan. 17, 2017.

* cited by examiner

*Primary Examiner* — Minh N Trinh
(74) *Attorney, Agent, or Firm* — Oblon, McClelland, Maier & Neustadt, L.L.P.

(57) ABSTRACT

The present invention provides a maintenance board that can be used for a maintenance process other than removing static electricity from a component mounting device by being conveyed by a conveyance device of the component mounting device. The maintenance board is conveyed to the conveyance device of the component mounting device. The maintenance board includes at least one of: a brush configured to brush a maintenance target object; a cleaning nozzle configured to be held in an attachable manner to a work head of the component mounting device and to blow air to the maintenance target object; a pressure sensor configured to measure a detachable load of a component to a suction nozzle attached to the work head and a mounting load of a component to a board; and a blower configured to blow air toward the work head.

4 Claims, 11 Drawing Sheets

MAINTENANCE BOARD

TECHNICAL FIELD

The present disclosure relates to a maintenance board for maintaining a component mounting device.

BACKGROUND ART

In the related art, various techniques have been proposed for a maintenance board for maintaining a component mounting device. For example, Patent Literature 1 describes a component mounting machine in which a circuit board is conveyed by a conveyor and a component supplied by a feeder is picked up by a suction nozzle and mounted on the circuit board. A first maintenance unit for removing static electricity of the suction nozzle is disposed in the component mounting machine, and the component mounting machine regularly conveys, with the conveyor, a second maintenance unit having a static electricity removal speed or effect duration of the suction nozzle different from that of the first maintenance unit, removes static electricity in an emergency with the first maintenance unit, and when the second maintenance unit is conveyed to a predetermined position by the conveyor, moves the suction nozzle to a maintenance position and removes static electricity from the suction nozzle in a preventive manner with the second maintenance unit.

The second maintenance unit is installed on a conveyance plate having the same width as the circuit board, and the component mounting machine conveys the second maintenance unit to the predetermined position by mounting the conveyance plate on the conveyor and conveying the conveyance plate.

PATENT LITERATURE

Patent Literature 1: Japanese Patent No. 5679432

BRIEF SUMMARY

Technical Problem

That is, with the component mounting machine described in Patent Literature 1, the maintenance unit for removing static electricity can be conveyed by a conveyor. However, it is desirable to convey with a conveyor belt maintenance unit other than the maintenance unit for removing static electricity.

The present disclosure is made in view of the above circumstances, and an object of the present disclosure is to provide a maintenance board that can be used for a maintenance process, other than removing static electricity from a component mounting device, by being conveyed by a conveyance device of the component mounting device.

Solution to Problem

The present specification discloses a maintenance board conveyed by a conveyance device of a component mounting device, the maintenance board comprising at least one of: a brush configured to brush a maintenance target object; a cleaning nozzle configured to be held in an attachable manner to a work head of the component mounting device and to blow air to the maintenance target object; a first sensor configured to measure positive pressure of air blown from a suction nozzle attached to the work head or a negative pressure of air sucked into the suction nozzle; a second sensor configured to measure a mounting load of a component on a board by the suction nozzle attached to the work head; and a blower configured to blow air toward the work head.

Advantageous Effect

According to the present disclosure, the maintenance board can be used for a maintenance process other than removing static electricity from the component mounting device by being conveyed by the conveyance device of the component mounting device.

DESCRIPTION OF EMBODIMENTS

Figure 1:
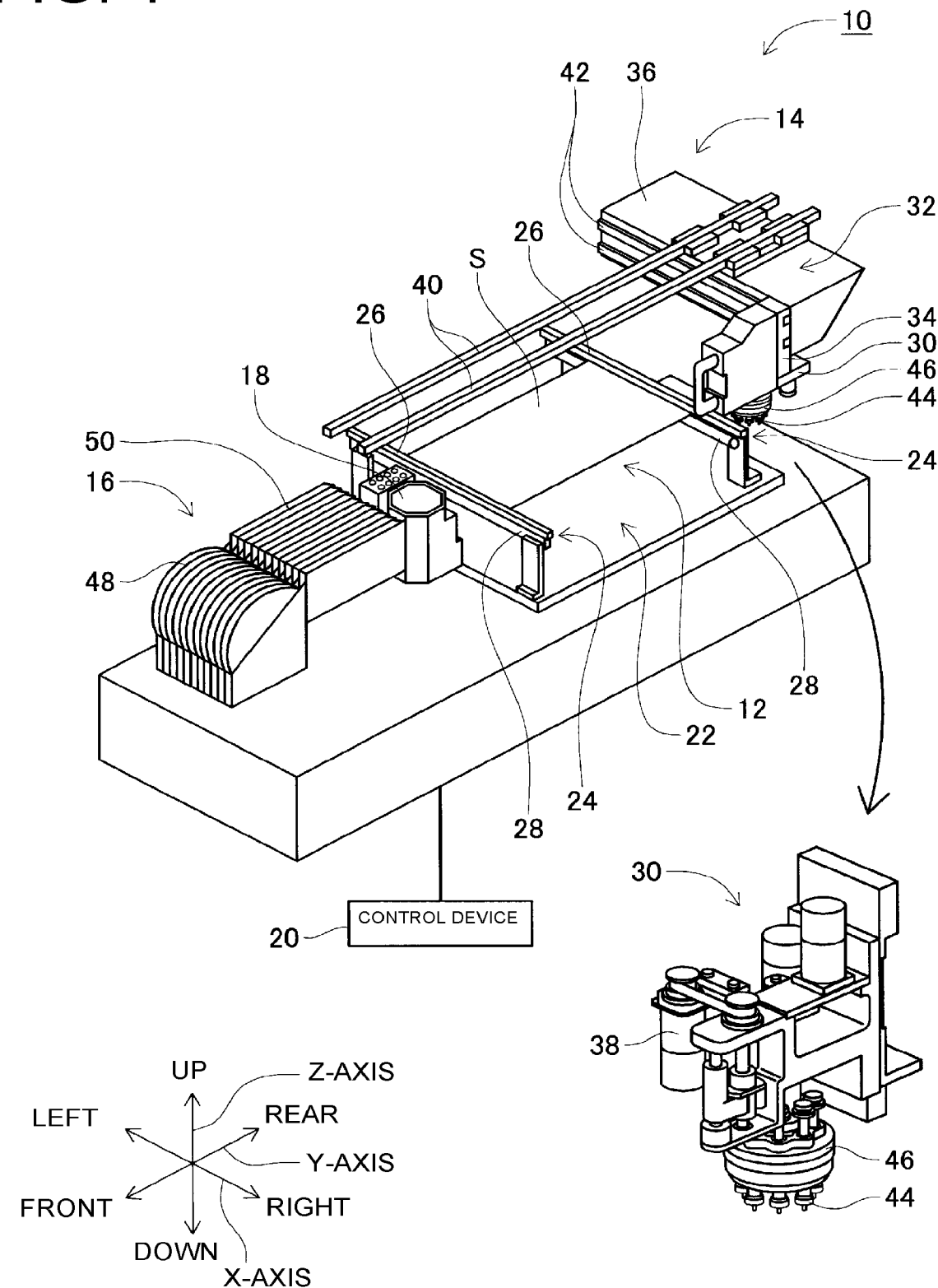
FIG. 1 is a perspective view of component mounting device 10.

Preferred embodiments of the present disclosure are described below with reference to the drawings. In the drawing, the left-right direction is the X-axis direction, the front-rear direction is the Y-axis direction, and the up-down direction is the Z-axis direction.

(1) Configuration of Component Mounting Device 10

FIG. 1 illustrates component mounting device 10. Component mounting device 10 is a device configured to execute mounting work of a component on board S. Component mounting device 10 includes board conveyance and holding device 12, component picking up device 14, reel component supply device 16, component camera 18, control device 20, and the like. Board S may be a printed wiring board, a printed circuit board, or the like.

Board conveyance and holding device 12 includes conveyance device 22 and clamping device 24. Conveyance device 22 includes support plates 26, 26 which are provided in the front and rear of FIG. 1 with a space therebetween and extend in the left-right direction, and conveyor belts 28, 28 which are provided on the faces of support plates 26, 26 which face each other. Conveyor belts 28, 28 span in an endless manner over a driving wheel and a driven wheel provided that are provided on the left and right sides of support plates 26 and 26. Board S is placed on the upper faces of the pair of conveyor belts 28, 28 and is conveyed from left to right. Clamping device 24 is a device configured to hold board S. With this, board conveyance and holding device 12 conveys board S and fixedly holds board S at a work position.

Component picking up device 14 includes work head 30 and work head moving device 32. Work head 30 is attached to the front face of work head moving device 32. Work head moving device 32 includes X-axis slider 34, Y-axis slider 36, Z-axis motor 38, and the like. To the front face of Y-axis slider 36, which is slidable in the front-rear direction, X-axis slider 34 is attached so as to be slidable in the left-right direction. Y-axis slider 36 is slidably attached to a pair of left and right guide rails 40, 40 extending in the front-rear direction. Guide rails 40, 40 are fixed to the inside of component mounting device 10. A pair of upper and lower guide rails 42, 42 extending in the left-right direction is provided on the front face of Y-axis slider 36, and X-axis slider 34 is attached to guide rails 42, 42 so as to be slidable in the left-right direction. Work head 30 is moved in the left-right direction as X-axis slider 34 is moved in the left-right direction, and is moved in the front-rear direction as Y-axis slider 36 is moved in the front-rear direction. Each of sliders 34, 36 is driven by a driving motor (not illustrated). Further, each of sliders 34, 36 is equipped with a position sensor (not illustrated), and control device 20 controls the driving motor of each of sliders 34, 36 while receiving positional information from the position sensors.

Work head 30 includes nozzle holding section 46 configured to support multiple suction nozzles 44, each of which picks up a component, such that suction nozzles 44 are moved up and down. Nozzle holding section 46 is configured to be rotatable about an axis parallel to the Z-axis. In the present embodiment, work head 30 includes eight suction nozzles 44. With the use of pressure, suction nozzle 44 picks up a component with a nozzle tip or releases a component picked up with the nozzle tip. Suction nozzle 44 is positioned, by the holder lifting and lowering device having Z-axis motor 38 as a driving source, at a specific phase of the rotational phases of nozzle holding section 46 and engages with a holder lifting and lowering device. As a result, suction nozzle 44 is lifted and lowered in the Z-axis direction (up-down direction) orthogonal to the X-axis direction and the Y-axis direction.

Reel component supply device 16 includes reels 48 around which a tape storing components is wound and is detachably attached to the front of component mounting device 10. The tape is unwound from reel 48 and is sent, by feeder section 50, to a pick-up position where the component is picked up by work head 30. Component camera 18 is disposed in front of support plate 26 on the front side of conveyance device 22. The imaging range of component camera 18 is above component camera 18. Component camera 18 images the state of the component picked up by suction nozzle 44 when suction nozzle 44 that has picked up the component passes over component camera 18, and outputs image data thereof to control device 20.

Figure 2:
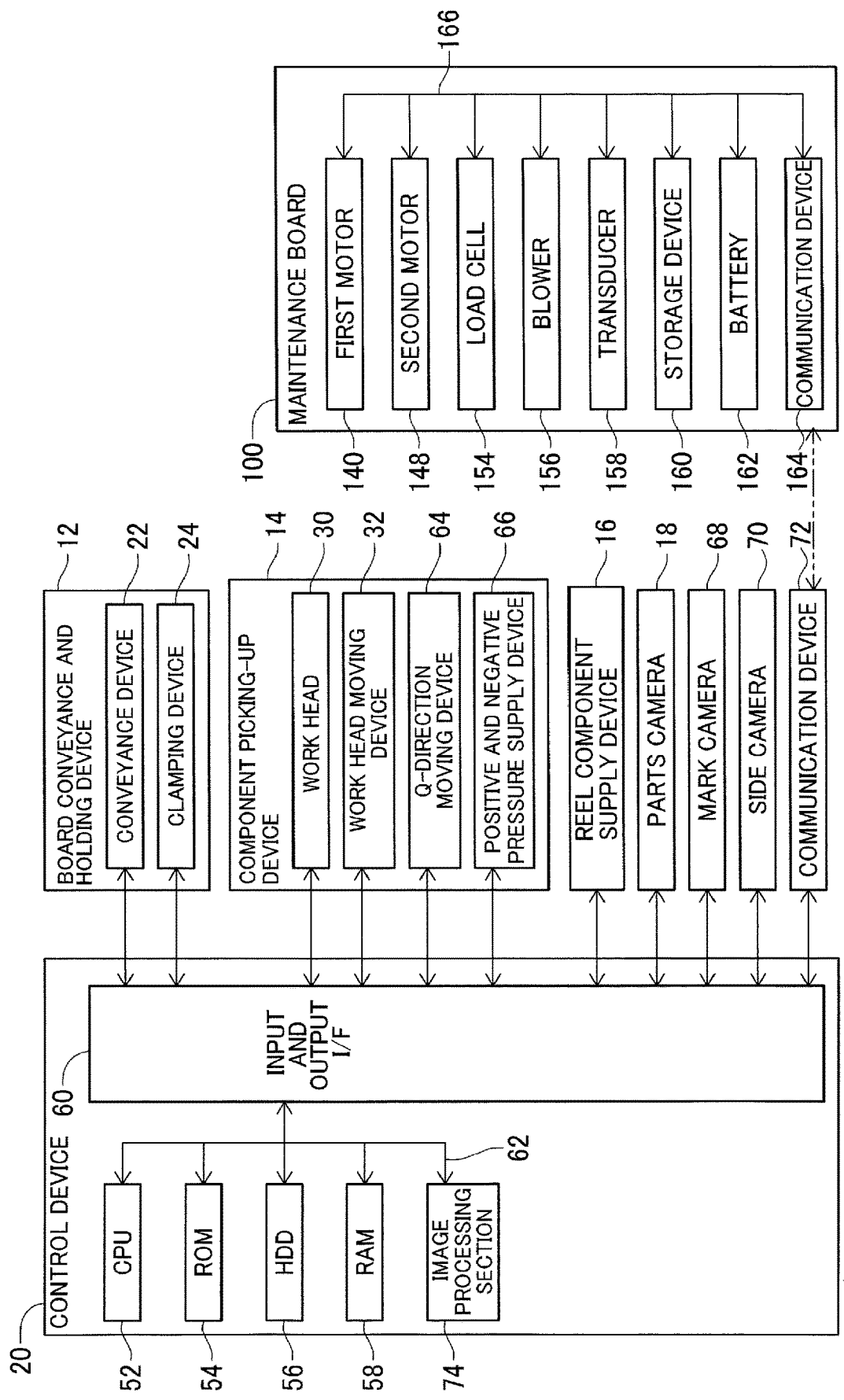
FIG. 2 is a block diagram illustrating electrical connections of control device 20 and electrical connections of maintenance board 100.

As illustrated in FIG. 2, control device 20 is configured as a microprocessor with central processing unit (CPU) 52 at its center and includes read only memory (ROM) 54 for storing process programs and the like, hard disk drive (HDD) 56 for storing various kinds of data, random access memory (RAM) 58 used as a work region, input/output interface 60 for exchanging electrical signals with external devices, and the like, all of which are connected via bus 62. ROM 54 stores process programs for implementing flowcharts of FIGS. 5, 7, 9, 11, 13, 15, 17, and 19, which will be described later.

Control device 20 is connected to conveyance device 22, clamping device 24, work head 30, work head moving device 32, reel component supply device 16, and component camera 18 in a bidirectional communication manner. Further, control device 20 is connected to Q-direction moving device 64, positive and negative pressure supply device 66, mark camera 68, side camera 70, and communication device 72 in a bidirectional communication manner.

Q-direction moving device 64 is configured to rotate nozzle holding section 46 about an axis parallel to the Z-axis and is built into work head 30. Positive and negative pressure supply device 66 is a device for causing suction nozzle 44 to communicate with a negative pressure air passage and a positive pressure air passage, and has a structure in which a component is picked up and held by suction nozzle 44 with a negative pressure and the component is released from suction nozzle 44 with a supply of a small amount of positive pressure. Q-direction moving device 64 and positive and negative pressure supply device 66 constitute component picking up device 14.

Mark camera 68 is attached to work head 30 in a state of facing downward, and is moved together with work head 30 in the X-direction, the Y-direction, and the Z-direction. With this, mark camera 68 images any position on the picking-up position of feeder section 50, board S, and the like, and outputs the image data to control device 20. Side camera 70 is attached to work head 30 and faces a direction parallel to a plane including the X-axis and the Y-axis. Side camera 70 includes, for example, a charge coupled device (CCD) image sensor or the like, receives light reflected by reflective body 80 described later, and outputs image data of the side face of the component picked up by suction nozzle 44 to control device 20. Communication device 72 performs bidirectional communication wirelessly with maintenance board 100, which will be described later.

Control device 20 includes image processing section 74. Image processing section 74 processes image data obtained by component camera 18, mark camera 68, and side camera 70, and control device 20 acquires various kinds of information from the image data.

(2) Operation of Component Mounting Device 10

In component mounting device 10, with the above-described configuration, component mounting work is performed on board S held by board conveyance and holding device 12. Specifically, board S is conveyed to the work position by conveyance device 22 and is fixedly held by clamping device 24 at the work position. Next, mark camera 68 is moved above board S to image board S. In this way, information on the work position and the like of board S is obtained. Reel component supply device 16 supplies components at the pick-up position. Then, work head 30 is moved above the pick-up position of the component and holds the component with suction nozzle 44. Subsequently, suction nozzle 44 is imaged by side camera 70. Further, work head 30 holding the component is moved above component camera 18, and the component held by suction nozzle 44 is imaged by component camera 18. In this way, information on the holding position and the like of the component is obtained. Subsequently, work head 30 holding the component is moved above board S, and the measurement error of the holding position of board S, the component, and the like are corrected. Then, suction nozzle 44 releases the component, mounting the component on board S.

(3) Configuration of Maintenance Board 100

Figure 3:
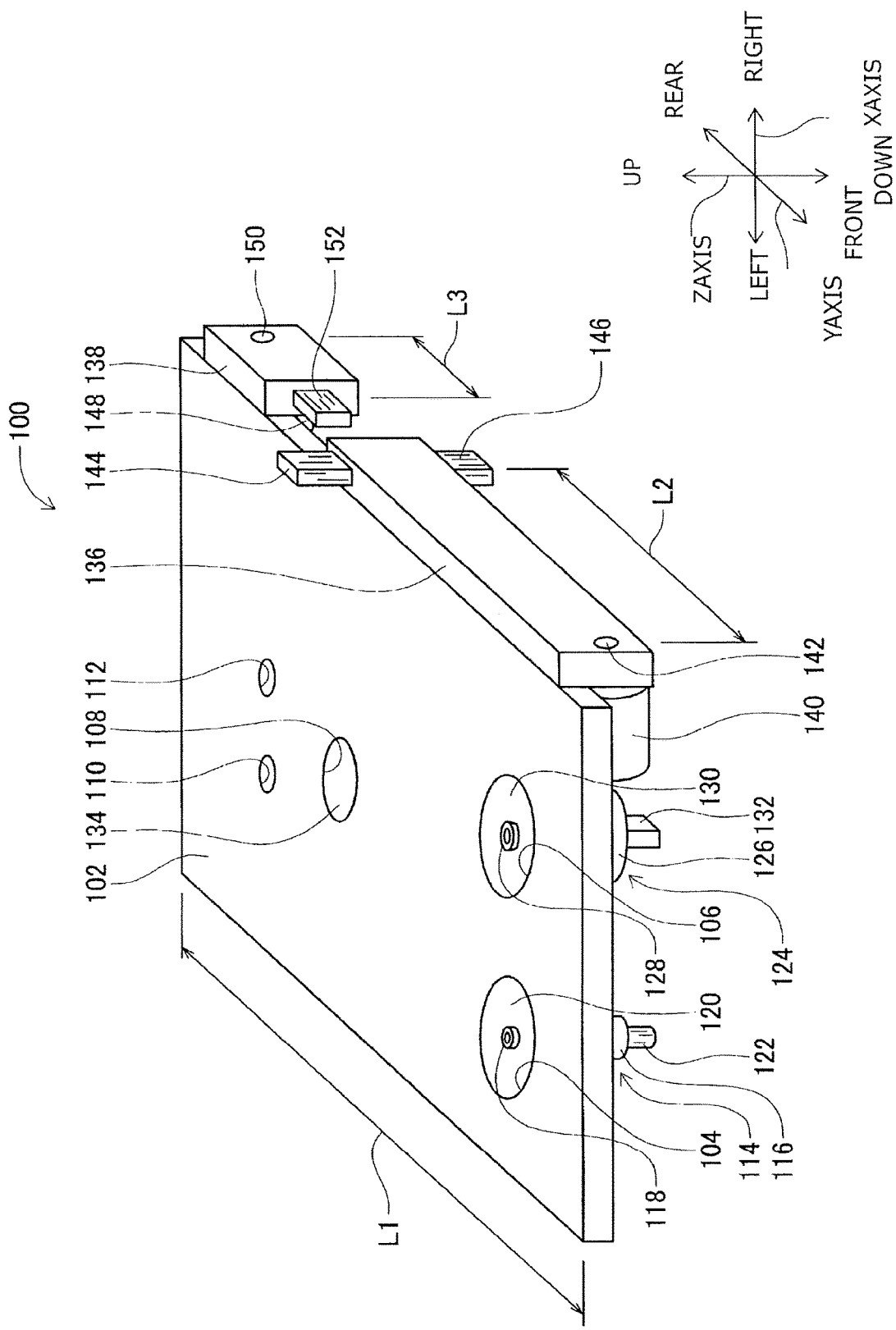
FIG. 3 is a perspective view of maintenance board 100.

FIG. 3 illustrates maintenance board 100. Maintenance board 100 is a board used for maintenance of component mounting device 10 and is conveyed to the work position by conveyance device 22 at the time of maintenance and fixedly held by clamping device 24 at the work position.

Maintenance board 100 includes board main body 102. Board main body 102 is a flat plate having a rectangular shape in plan view, and width L1 in the front-rear direction is the same as the width of board S. Thus, maintenance board 100 is conveyed and held by board conveyance and holding device 12 in the same manner as board S. Board main body 102 is provided with first hole 104, second hole 106, third hole 108, fourth hole 110, and fifth hole 112.

First hole 104 is a stepped through-hole. In first hole 104, lens cleaning nozzle 114 is held in a manner so that lens cleaning nozzle 114 can be taken out by nozzle holding section 46 of work head 30. Lens cleaning nozzle 114 includes nozzle main body 116, holding pipe 118, flange 120, lens cleaning brush 122, and the like. Nozzle main body 116 has a cylindrical shape. While lens cleaning nozzle 114 is held in first hole 104, the longitudinal direction of nozzle main body 116 aligns with the up-down direction. Holding pipe 118 is provided so as to protrude from a first end face of nozzle main body 116 and faces upward while lens cleaning nozzle 114 is held in first hole 104. An air passage which communicates with a second end face on the opposite side of the first end face (i.e., the end face provided with holding pipe 118) of nozzle main body 116 is formed in holding pipe 118. Flange 120 is provided to protrude from the outer periphery of the first end face (i.e., the end face provided with holding pipe 118) of nozzle main body 116, and forms a flange of the first end face (i.e., the end face provided with holding pipe 118) of nozzle main body 116. While lens cleaning nozzle 114 is held in first hole 104, flange 120 loosely fits into first hole 104 and engages with the step of first hole 104. Lens cleaning brush 122 is provided on the second end face on the opposite side of the first end face (i.e., the end face provided with holding pipe 118) of nozzle main body 116 and faces downward while lens cleaning nozzle 114 is held in first hole 104.

Therefore, in a case where work head 30 is moved upward after holding pipe 118 of lens cleaning nozzle 114 is held by nozzle holding section 46 of work head 30, lens cleaning nozzle 114 can be taken out from first hole 104. When holding pipe 118 of lens cleaning nozzle 114 is held by nozzle holding section 46 of work head 30, the air passage of lens cleaning nozzle 114 communicates with the positive pressure air passage of work head 30 via positive and negative pressure supply device 66. As a result, in lens cleaning nozzle 114, positive pressure air can be blown from the second end face (i.e., the end face provided with lens cleaning brush 122) on the opposite side to the first end face (i.e, the end face provided with holding pipe 118) of nozzle main body 116. In a case where lens cleaning nozzle 114 is inserted into first hole 104 by moving lens cleaning nozzle 114 held by nozzle holding section 46 of work head 30 above first hole 104 and then moving work head 30 downward, lens cleaning nozzle 114 can be held again in first hole 104.

Second hole 106 is a stepped through-hole. In second hole 106, feeder cleaning nozzle 124 is held in a manner so that feeder cleaning nozzle 124 can be taken out by nozzle holding section 46 of work head 30. Feeder cleaning nozzle 124 includes nozzle main body 126, holding pipe 128, flange 130, nozzle head 132, and the like. Feeder cleaning nozzle 124 has the same configuration as lens cleaning nozzle 114 described above except for nozzle head 132. Further, feeder cleaning nozzle 124 is held in second hole 106 in the same way lens cleaning nozzle 114 is held in first hole 104.

That is, nozzle main body 126, holding pipe 128, and flange 130 of feeder cleaning nozzle 124 correspond to nozzle main body 116, holding pipe 118, and flange 120 of lens cleaning nozzle 114 described above. Further, second hole 106 that holds feeder cleaning nozzle 124 corresponds to first hole 104 that holds lens cleaning nozzle 114 described above. Therefore, in the description of feeder cleaning nozzle 124, the description of a portion substantially common to lens cleaning nozzle 114 described above is omitted.

Nozzle head 132 is provided on a second end face on the opposite side of the first end face (i.e., the end face provided with holding pipe 128) of nozzle main body 126 and faces downward while feeder cleaning nozzle 124 is held in second hole 106. Nozzle head 132 communicates with an air passage of feeder cleaning nozzle 124. Accordingly, when holding pipe 128 of feeder cleaning nozzle 124 is held by nozzle holding section 46 of work head 30, the air passage of feeder cleaning nozzle 124 communicates with the positive pressure air passage and the negative pressure air passage of work head 30 via positive and negative pressure supply device 66. As a result, in feeder cleaning nozzle 124, positive pressure air can be blown from nozzle head 132 provided on the second end face on the opposite side of the first end face (end face provided with holding pipe 128) of nozzle main body 126, and negative pressure air can be sucked into nozzle head 132.

Third hole 108 is a vertical hole having a predetermined depth. Load cell 154, which will be described later, is provided in third hole 108 and is inserted such that spherical seat 134 of the load cell is slidable in the up-down direction. Fourth hole 110 is a through hole. A discharging port of blower 156, which will be described later, communicates with the lower opening of fourth hole 110. Fifth hole 112 is a through hole. Transducer 158, which will be described later, is provided to the lower opening of fifth hole 112.

Maintenance board 100 includes first arm section 136 and second arm section 138 on the right side face thereof. First arm section 136 and second arm section 138 are elongated. A first end of first arm section 136 in the longitudinal direction is pivotally supported so as to be rotatable about output shaft 142 of first motor 140. As a result, first arm section 136 can shift between a collapsed state and an erected state with respect to maintenance board 100. First arm section 136 in FIG. 3 represents the collapsed state, and is flush with board main body 102. First motor 140 is fixed to the lower face of board main body 102.

First arm section 136 is provided with first brush 144 and second brush 146 at a second end on the opposite side of the first end (i.e., the end pivotally supported by output shaft 142 of first motor 140) in the longitudinal direction. First brush 144 is directed upward from maintenance board 100 by being disposed on a face, among six faces constituting first arm section 136, which faces upward when first arm section 136 is in the collapsed state. Second brush 146 is directed downward from maintenance board 100 by being disposed on a face, among the six faces constituting first arm section 136, which faces downward when first arm section 136 is in the collapsed state. That is, both brushes 144 and 146 are provided, at the second end of first arm section 136, on two side faces opposite to each other in the traverse direction of first arm section 136 (i.e., in the up-down direction when first arm section 136 is in the collapsed state). Distance L2 from both brushes 144,146 to the pivot point of output shaft 142 of first motor 140 corresponds to the distance from maintenance board 100 to the maintenance target object when first brush 144 or second brush 146 performs maintenance. Examples of the maintenance target object include suction nozzle 44, side camera 70, and reflective body 80.

A first end of second arm section 138 in the longitudinal direction is pivotably supported in a rotatable manner by output shaft 150 of second motor 148. As a result, second arm section 138 can shift between a collapsed state and an erected state with respect to maintenance board 100. Second arm section 138 in FIG. 3 represents the collapsed state, and is flush with board main body 102. Second motor 148 is fixed to the lower face of board main body 102.

Second arm section 138 is provided with third brush 152 at an end face of the second end on the opposite side to the first end (i.e., the end pivotally supported by output shaft 150 of second motor 148) in the longitudinal direction. Third brush 152 is provided on a face, among six faces constituting second arm section 138, which faces forward when second arm section 138 is in the collapsed state, and directed forward from the face. Distance L3 from third brush 152 to the pivot point of output shaft 150 of second motor 148 corresponds to the distance from maintenance board 100 to the maintenance target object when third brush 152 performs maintenance. The maintenance target object may be, for example, mark camera 68.

First motor 140 is positioned rearward from the front face of board main body 102. Further, the front face of first arm section 136 in the collapsed state is also positioned rearward from the front face of board main body 102 in the same manner. Second motor 148 is positioned forward from the rear face of board main body 102. Further, the rear face of second arm section 138 in the collapsed state is also positioned forward from the rear face of board main body 102 in the same manner. With such a structure, the front end and the rear end of board main body 102 can be placed on the upper faces of the pair of conveyor belts 28, 28. Thus, maintenance board 100 can be conveyed and held by board conveyance and holding device 12 in the same manner as board S.

In maintenance board 100, as illustrated in FIG. 2, in addition to first motor 140 and second motor 148, load cell 154, blower 156, transducer 158, storage device 160, battery 162, and communication device 164 are connected via bus 166.

Load cell 154 is disposed in third hole 108 of board main body 102 and can measure a load acting on spherical seat 134 near the upper opening of third hole 108 from above. Blower 156 is fixedly provided on the lower face of board main body 102 such that the discharging port thereof communicates with the lower opening of fourth hole 110 of board main body 102. As a result, blower 156 can blow a strong wind upward through the upper opening of fourth hole 110. Transducer 158 is fixedly provided on the lower face of board main body 102 such that the sensor portion thereof is disposed at the lower opening of fifth hole 112 of board main body 102. This allows transducer 158 to measure the positive pressure of air blown from the upper opening of fifth hole 112 and directed into fifth hole 112, or the negative pressure of air sucked from fifth hole 112 through the upper opening of fifth hole 112. Storage device 160 is HDD, RAM, or the like, and can store various kinds of data. Battery 162 is a power supply of maintenance board 100. Communication device 164 performs bidirectional communication with communication device 72 of control device 20 in a wireless manner.

Maintenance board 100 may be electronically configured to be controlled by itself by being provided with a CPU, ROM, and the like.

(4) Maintenance Operations of Maintenance Board 100

Next, examples of maintenance operations of maintenance board 100 will be described with reference to FIGS. 4 to 19. When each maintenance operation of maintenance board 100 is performed, as described above, maintenance board 100 is conveyed to the work position by conveyance device 22 and is fixedly held at the work position by clamping device 24. In FIGS. 4, 6, 8, 10, 12, 14, 16, and 18, a part of the configuration may be omitted and the dimensional ratio and the like of each section depicted are not necessarily accurate.

(4-1) First Maintenance Operation of Maintenance Board 100

Figure 4:
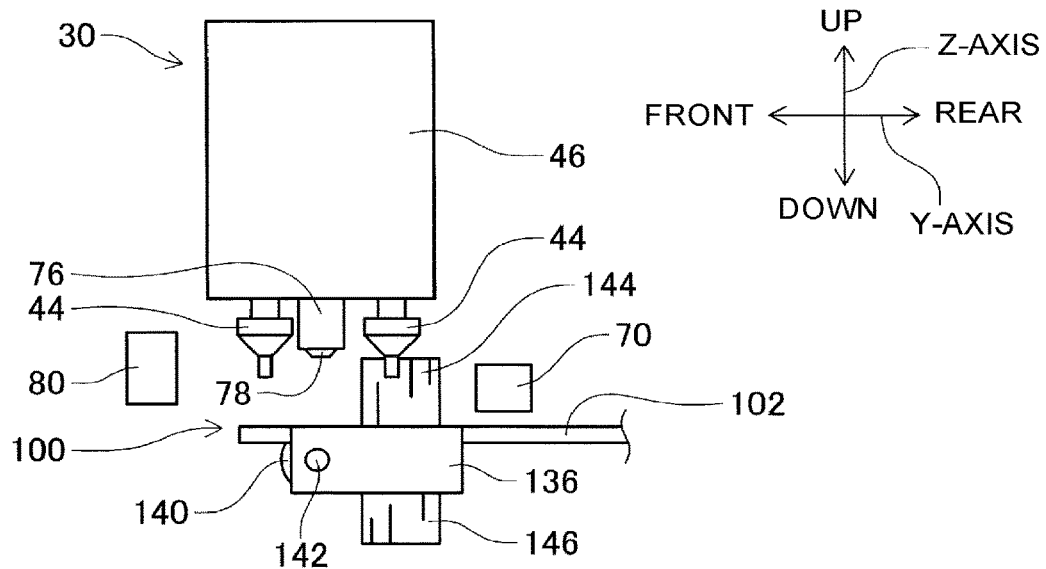
FIG. 4 is a schematic diagram illustrating a first maintenance operation of maintenance board 100.

The first maintenance operation of maintenance board 100 is an operation of cleaning suction nozzle 44 by brushing suction nozzle 44 with first brush 144 of first arm section 136, as illustrated in FIG. 4. In the first maintenance operation of maintenance board 100, first arm section 136 is in the collapsed state. Accordingly, first brush 144 faces upward from board main body 102, and suction nozzle 44 is moved into first brush 144 facing upward.

Figure 5:
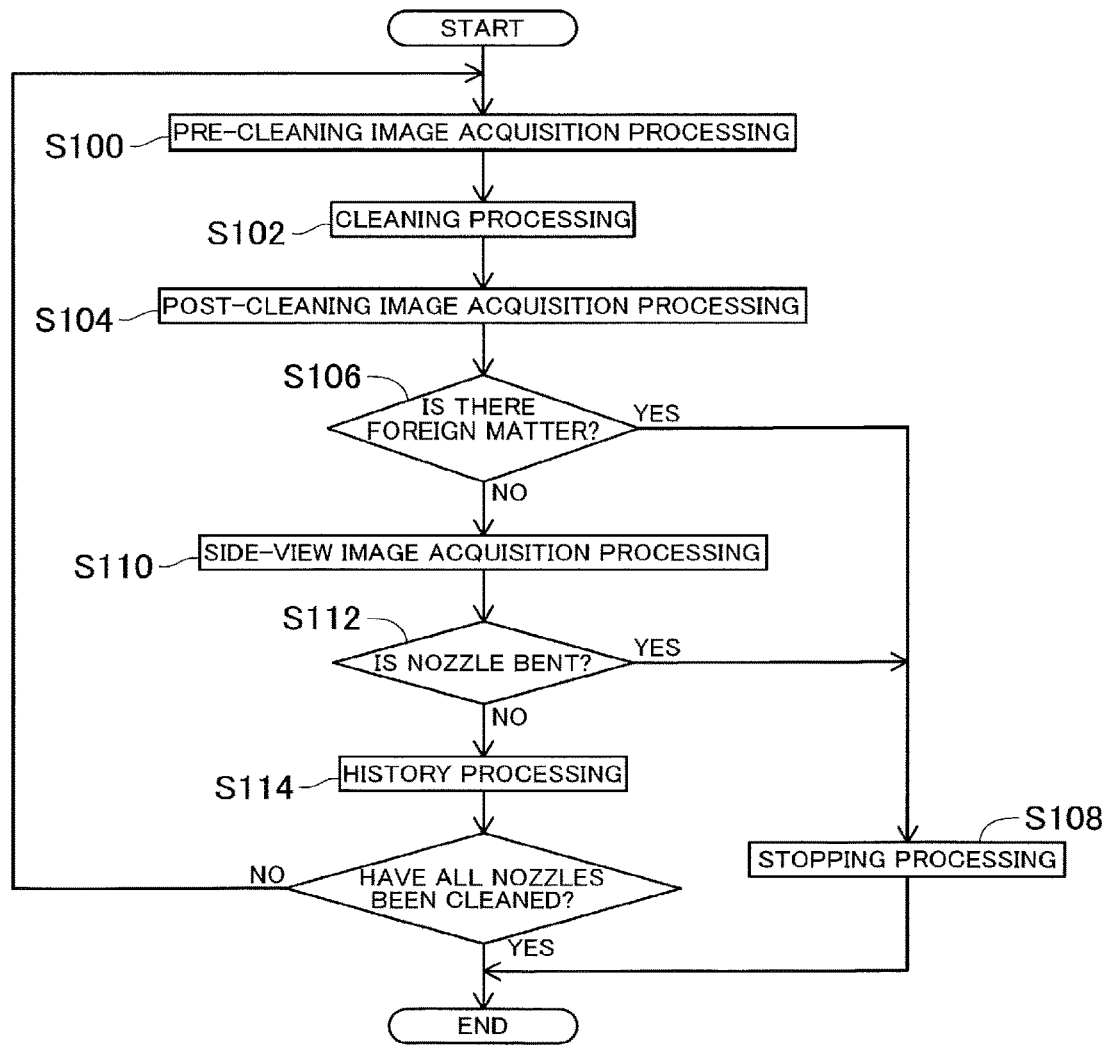
FIG. 5 is a flowchart illustrating the first maintenance operation of maintenance board 100.

When the first maintenance operation of maintenance board 100 is performed, the process program for implementing the flowchart of FIG. 5 is executed by CPU 52 of control device 20. When the process program is executed, as illustrated in FIG. 5, CPU 52 of control device 20 performs a pre-cleaning image acquisition process (step S100). In this process, suction nozzle 44 as a cleaning target is imaged by component camera 18. Thus, image data obtained by imaging suction nozzle 44 before cleaning is acquired.

When the image data is acquired, CPU 52 of control device 20 performs a cleaning process (step S102). In this process, suction nozzle 44 as the cleaning target is moved into first brush 144 so that suction nozzle 44 is cleaned with first brush 144. The movement of suction nozzle 44 is performed by moving work head 30 in the X-direction (left-right direction) or the Y-direction (front-rear direction) or by moving nozzle holding section 46 in the Q-direction (i.e., a rotational direction about an axis parallel to the Z-axis).

As illustrated in FIG. 4, protruding section 76 is provided at the center of the lower face of nozzle holding section 46 of work head 30 so as to protrude downward, and head position recognition mark 78 is provided at the center of the lower face of protruding section 76. In the same manner as suction nozzle 44, head position recognition mark 78 can be moved into first brush 144 by the movement of work head 30 or nozzle holding section 46, and thus head position recognition mark 78 can be cleaned by first brush 144.

Returning to FIG. 5, in a case where the process of step S102 is performed, CPU 52 of control device 20 performs a post-cleaning image acquisition process (step S104). In this process, suction nozzle 44 as the cleaning target is imaged by component camera 18. Thus, image data obtained by imaging suction nozzle 44 after cleaning is acquired.

When the image data is acquired, CPU 52 of control device 20 determines whether there is foreign matter in suction nozzle 44 as the cleaning target (step S106). This determination is performed by comparing and collating the image data before cleaning acquired in the process of step S100 with the image data after cleaning acquired in the process of step S104 in image processing section 74.

Here, in a case where there is foreign matter in suction nozzle 44 as the cleaning target (step S106: YES), CPU 52 of control device 20 performs a stopping process (step S108). In this process, CPU 52 of control device 20 ends the process program. However, in this process, CPU 52 of control device 20 may repeatedly execute the processes from step S100 to step S106. The number of repetitions is limited to a predetermined count number.

On the other hand, in the case where there is no foreign matter in suction nozzles 44 as the cleaning target (step S106: NO), CPU 52 of control device 20 performs a side-view image acquisition process (step S110). In this process, the side face of suction nozzle 44 as the cleaning target is imaged by side camera 70. Thus, image data obtained by imaging the side face of suction nozzle 44 after cleaning is acquired. As illustrated in FIG. 4, side camera 70 receives light reflected by reflective body 80, and outputs the image data of the side face of suction nozzle 44 to control device 20. Reflective body 80 is attached to work head 30.

Returning to FIG. 5, in a case where the process of step S110 is performed, CPU 52 of control device 20 determines whether suction nozzle 44 as the cleaning target is bent (step S112). This determination is performed based on the image data of the side face of suction nozzle 44 acquired in the process of step S110.

Here, in a case where suction nozzle 44 as the cleaning target is bent (step S112: YES), CPU 52 of control device 20 performs the above-described stopping process (step S108). On the other hand, in a case where suction nozzle 44 as the cleaning target is not bent (step S112: NO), CPU 52 of control device 20 performs history processing (step S114). In this processing, CPU 52 of control device 20 stores the image data acquired in the processes of steps S100, S104, and S110 in HDD 56 or the like in association with a nozzle identification number (ID) of suction nozzle 44 as the cleaning target. However, the image data and the nozzle ID may be transmitted to maintenance board 100 via communication devices 72, 164 so as to be stored in association with each other in storage device 160 of maintenance board 100 or stored in association with each other in a personal computer (PC) or the like connected to component mounting device 10.

When the image data is stored, CPU 52 of control device 20 determines whether all suction nozzles 44 have been cleaned with first brush 144 (step S116). This determination is performed based on, for example, the nozzle ID of suction nozzle 44 as the cleaning target. Here, in a case where all suction nozzles 44 have not been cleaned by first brush 144 (step S116: NO), CPU 52 of control device 20 returns to step S100 and repeats the process of step S100 and subsequent steps. On the other hand, in a case where all suction nozzles 44 have been cleaned by first brush 144 (step S116: Yes), CPU 52 of control device 20 ends the process program.

As described in detail above, in the first maintenance operation of maintenance board 100, since first brush 144 of maintenance board 100, which is conveyed by conveyance device 22 during the first maintenance operation, is used and it is not necessary to secure a permanent space for first brush 144 in component mounting device 10, it is highly cost-effective.

(4-2) Second Maintenance Operation of Maintenance Board 100

Figure 6:
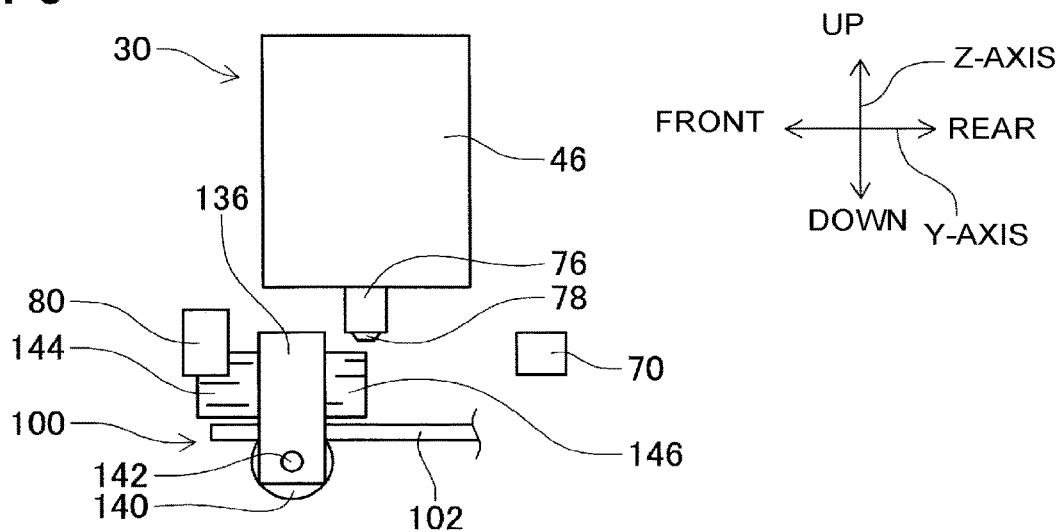
FIG. 6 is a schematic diagram illustrating a second maintenance operation of maintenance board 100.

The second maintenance operation of maintenance board 100 is an operation of cleaning reflective body 80 or side camera 70 by brushing reflective body 80 with first brush 144 of first arm section 136 and brushing side camera 70 with second brush 146 of first arm section 136, as illustrated in FIG. 6. In the second maintenance operation of maintenance board 100, first arm section 136 is in an erected state. Thus, first brush 144 faces forward while being separated from board main body 102, and reflective body 80 is moved into first brush 144 facing forward. Furthermore, second brush 146 faces rearward while being separated from board main body 102, and side camera 70 is moved into second brush 146 facing rearward.

Although suction nozzle 44 is not held by nozzle holding section 46 in FIG. 6, suction nozzle 44 may be held by nozzle holding section 46 in a case where first arm section 136 is not in contact with suction nozzle 44 when reflective body 80 or side camera 70 is being brushed.

Figure 7:
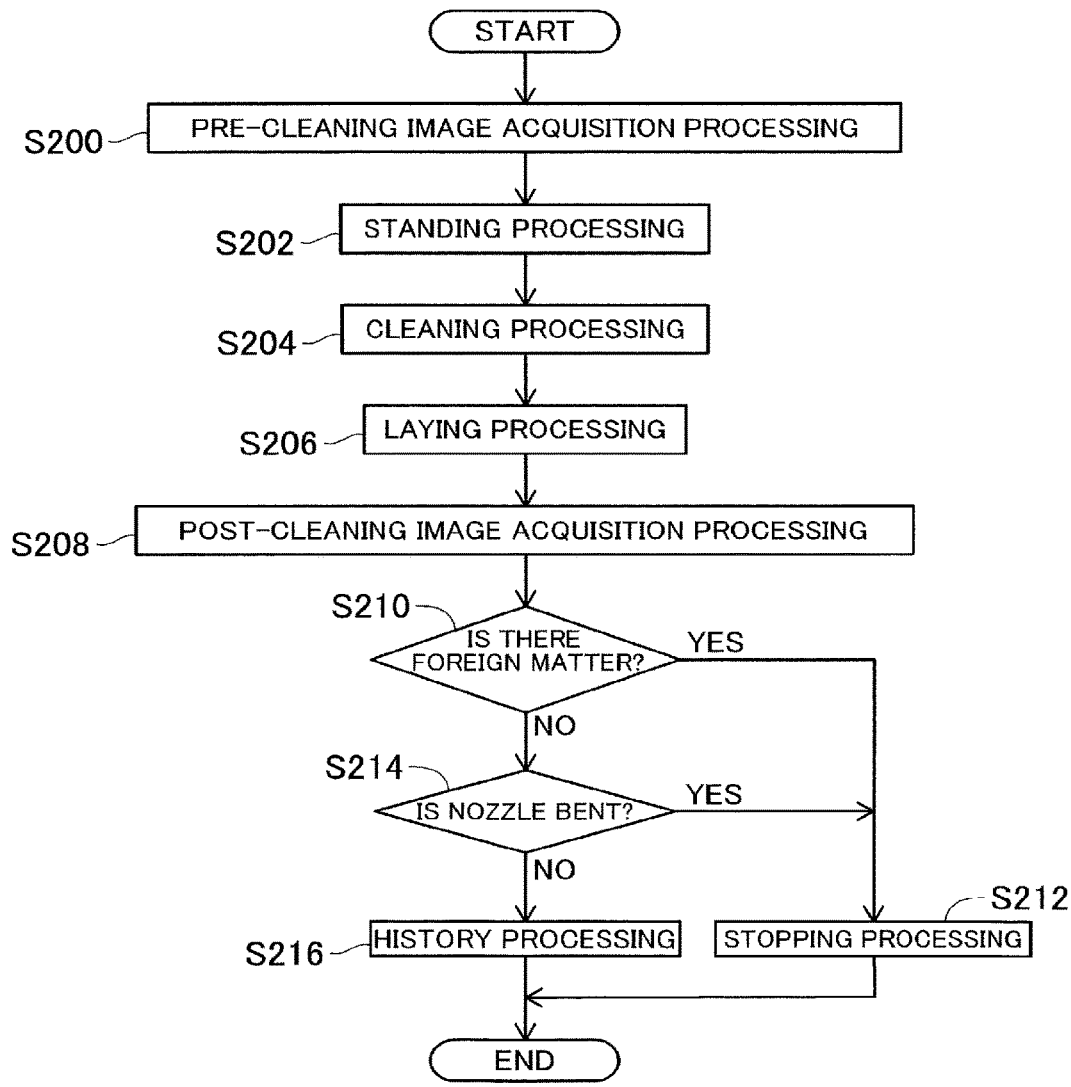
FIG. 7 is a flowchart illustrating the second maintenance operation of maintenance board 100.

When the second maintenance operation of maintenance board 100 is performed, the process program for implementing the flowchart of FIG. 7 is executed by CPU 52 of control device 20. When the process program is executed, as shown in FIG. 7, CPU 52 of control device 20 performs a pre-cleaning image acquisition process (step S200). In this process, reflective body 80 is imaged by side camera 70. Thus, image data obtained by imaging reflective body 80 before cleaning with side camera 70 before cleaning is acquired.

When the image data is acquired, CPU 52 of control device 20 performs an erecting process (step S202). In this process, by transmitting a control signal to maintenance board 100 via communication devices 72, 164, CPU 52 of control device 20 drives first motor 140 to put first arm section 136 in an erected state.

When first arm section 136 is in the erected state, CPU 52 of control device 20 performs a cleaning process (step S204). In this process, reflective body 80 is moved into first brush 144 so that reflective body 80 is cleaned with first brush 144. Furthermore, side camera 70 is moved into second brush 146 so that side camera 70 is cleaned with second brush 146. The movement of reflective body 80 and side camera 70 is performed by moving work head 30 in the X-direction (left-right direction), the Y-direction (front-rear direction), or the Z-direction (up-down direction).

When cleaning is performed, CPU 52 of control device 20 performs a collapsing process (step S206). In this process, by transmitting a control signal to maintenance board 100 via communication devices 72, 164, CPU 52 of control device 20 drives first motor 140 to set first arm section 136 in the collapsed state.

When first arm section 136 is in the collapsed state, CPU 52 of control device 20 performs a post-cleaning image acquisition process (step S208). In this process, reflective body 80 is imaged by side camera 70. Thus, image data obtained by imaging reflective body 80 after cleaning by side camera 70 after cleaning is acquired.

When the image data is acquired, CPU 52 of control device 20 determines whether there is foreign matter on reflective body 80 or side camera 70 (step S210). This determination is performed by comparing and collating the image data before cleaning acquired in the process of step S200 with the image data after cleaning acquired in the process of step S208 in image processing section 74.

Here, in a case where there is foreign matter in reflective body 80 or side camera 70 (step S210: YES), CPU 52 of control device 20 performs a stopping process (step S212). In this process, CPU 52 of control device 20 ends the process program. However, in this process, CPU 52 of control device 20 may repeatedly execute the processes from step S200 to step S210. The number of repetitions is limited to a predetermined count number.

On the other hand, in a case where there is no foreign matter on reflective body 80 and side camera 70 (step S210: NO), CPU 52 of control device 20 determines whether suction nozzle 44 is bent (step S214). This determination is performed based on the image data after cleaning acquired in the process of step S208. In a case where suction nozzle 44 is not held by nozzle holding section 46, this process is not executed, and the process of step S216 described later is executed.

In the case where suction nozzle 44 is bent (step S214: YES), CPU 52 of control device 20 performs the above-described stopping process (step S212). On the other hand, in a case where suction nozzle 44 is not bent (step S214: NO), CPU 52 of control device 20 performs history processing (step S216). In this processing, CPU 52 of control device 20 stores the image data acquired in the processes of step S200 and step S208 in HDD 56 or the like. However, the image data may be transmitted to maintenance board 100 via communication devices 72, 164 so as to be stored in storage device 160 of maintenance board 100 or stored in the PC or the like connected to component mounting device 10. Thereafter, CPU 52 of control device 20 ends the process program.

As described in detail above, in the second maintenance operation of maintenance board 100, since first brush 144 and second brush 146 of maintenance board 100, which are conveyed by conveyance device 22 during the second maintenance operation, are used and it is not necessary to secure a permanent space for first brush 144 and second brush 146 in component mounting device 10, it is highly cost-effective. Furthermore, by performing the second maintenance operation of maintenance board 100, cleaning by an operator can be omitted.

(4-3) Third Maintenance Operation of Maintenance Board 100

Figure 8:
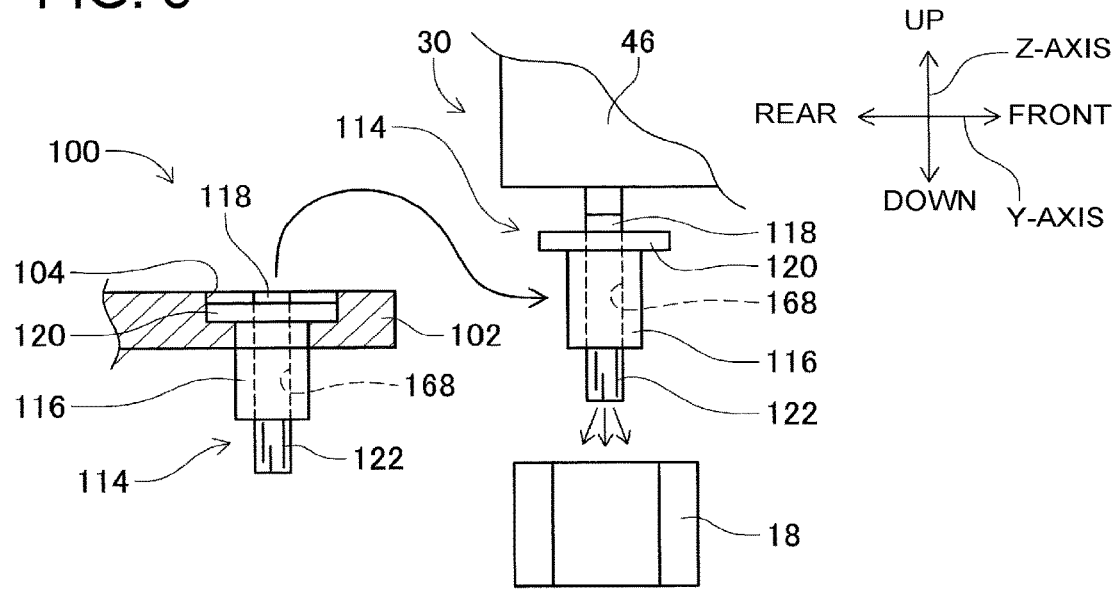
FIG. 8 is a schematic diagram illustrating a third maintenance operation of maintenance board 100.

The third maintenance operation of maintenance board 100 is an operation of cleaning component camera 18 by brushing component camera 18 with lens cleaning brush 122 of lens cleaning nozzle 114 and blowing positive pressure air from air passage 168 in lens cleaning nozzle 114 toward component camera 18, as illustrated in FIG. 8. The third maintenance operation of maintenance board 100 is performed while lens cleaning nozzle 114 is held by nozzle holding section 46 of work head 30.

Figure 9:
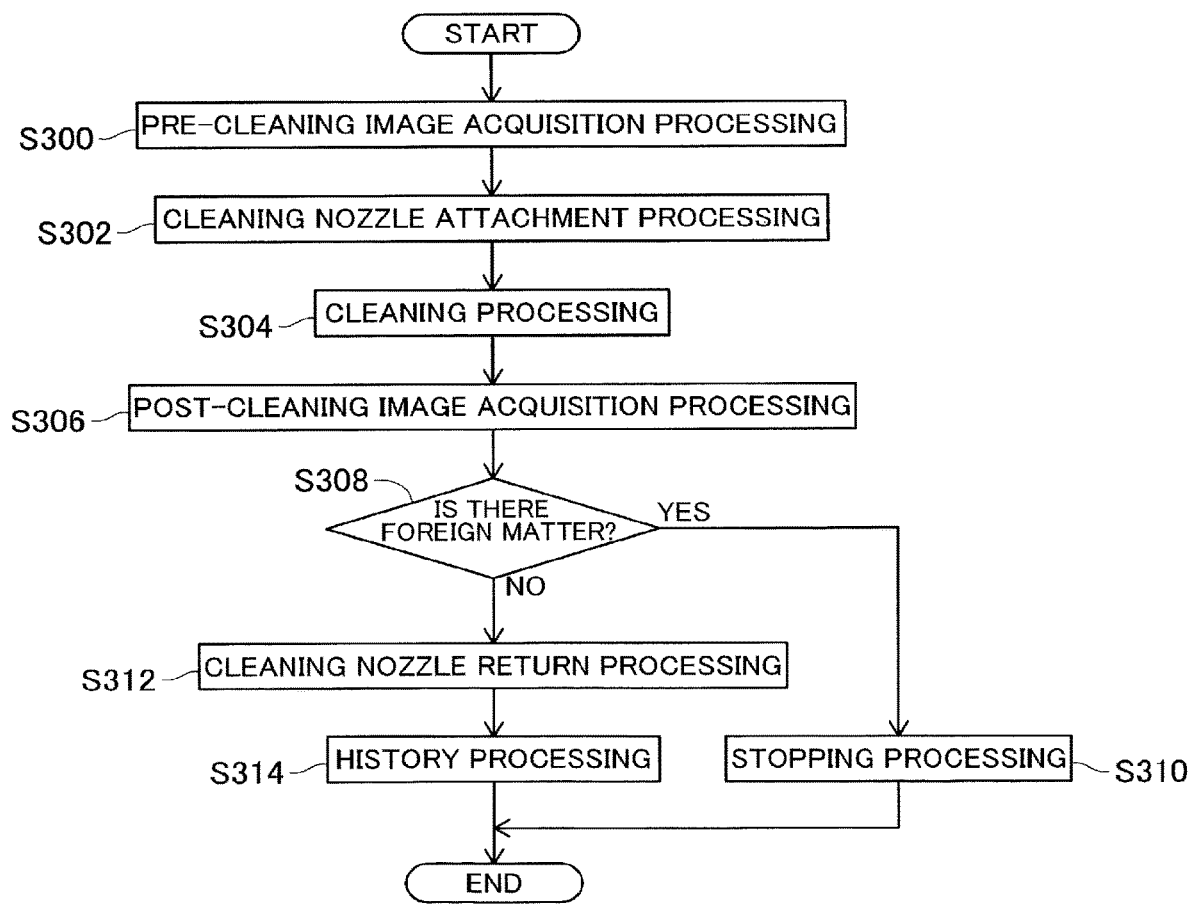
FIG. 9 is a flowchart illustrating the third maintenance operation of maintenance board 100.

When the third maintenance operation of maintenance board 100 is performed, the process program for implementing the flowchart of FIG. 9 is executed by CPU 52 of control device 20. When the process program is executed, as illustrated in FIG. 9, CPU 52 of control device 20 performs a pre-cleaning image acquisition process (step S300). In this process, imaging by component camera 18 before cleaning is performed. Thus, image data obtained by component camera 18 before cleaning is acquired.

When the image data is acquired, CPU 52 of control device 20 performs a cleaning nozzle attachment process (step S302). In this process, CPU 52 of control device 20 causes nozzle holding section 46 of work head 30 to hold lens cleaning nozzle 114 that is in first hole 104 of maintenance board 100. When lens cleaning nozzle 114 is held by nozzle holding section 46 of work head 30, as described above, air passage 168 of lens cleaning nozzle 114 communicates with the positive pressure air passage of work head 30 via positive and negative pressure supply device 66.

Thereafter, CPU 52 of control device 20 performs a cleaning process (step S304). In this process, lens cleaning brush 122 brushes component camera 18 by moving lens cleaning nozzle 114, and positive pressure air is blown from lens cleaning nozzle 114 toward component camera 18 by driving positive and negative pressure supply device 66. As a result, cleaning of component camera 18 is performed by lens cleaning nozzle 114. The movement of lens cleaning nozzle 114 is performed by moving work head 30 in the X-direction (i.e., the left-right direction) or the Y-direction (i.e., the front-rear direction), or by moving nozzle holding section 46 in the Q-direction (i.e., a rotational direction about an axis parallel to the Z-axis).

When cleaning is performed, CPU 52 of control device 20 performs a post-cleaning image acquisition process (step S306). In this process, imaging by component camera 18 after cleaning is performed. Thus, image data obtained by component camera 18 after cleaning is acquired. In this process, lens cleaning nozzle 114 is moved so that lens cleaning nozzle 114 is not imaged by component camera 18 in order to meet the imaging condition in the process of step S300.

When the image data is acquired, CPU 52 of control device 20 determines whether there is foreign matter on component camera 18 (step S308). This determination is performed by comparing and collating the image data before cleaning acquired in the process of step S300 with the image data after cleaning acquired in the process of step S306 in image processing section 74.

Here, in a case where there is foreign matter on component camera 18 (step S308: YES), CPU 52 of control device 20 performs a stopping process (step S310). In this process, CPU 52 of control device 20 ends the process program. However, in this process, CPU 52 of control device 20 may repeatedly execute the processes from step S300 to step S308. The number of repetitions is limited to a predetermined count number.

On the other hand, in a case where there is no foreign matter on component camera 18 (step S308: NO), CPU 52 of control device 20 performs a cleaning nozzle return process (step S312). In this process, CPU 52 of control device 20 returns lens cleaning nozzle 114 held by nozzle holding section 46 of work head 30 to first hole 104 of maintenance board 100.

Thereafter, CPU 52 of control device 20 performs history processing (step S314). In this processing, CPU 52 of control device 20 stores the image data acquired in the processes of step S300 and step S306 in HDD 56 or the like.

However, the image data may be transmitted to maintenance board 100 via communication devices 72, 164 so as to be stored in storage device 160 of maintenance board 100 or stored in the PC or the like connected to component mounting device 10. Thereafter, CPU 52 of control device 20 ends the process program.

As described in detail above, in the third maintenance operation of maintenance board 100, since lens cleaning nozzle 114 of maintenance board 100, which is conveyed by conveyance device 22 during the third maintenance operation, is used and it is not necessary to secure a permanent space for lens cleaning nozzle 114 in component mounting device 10, it is highly cost-effective. Further, by performing the third maintenance operation of maintenance board 100, cleaning of component camera 18 can be performed by using both positive pressure air and brushing.

(4-4) Fourth Maintenance Operation of Maintenance Board 100

Figure 10:
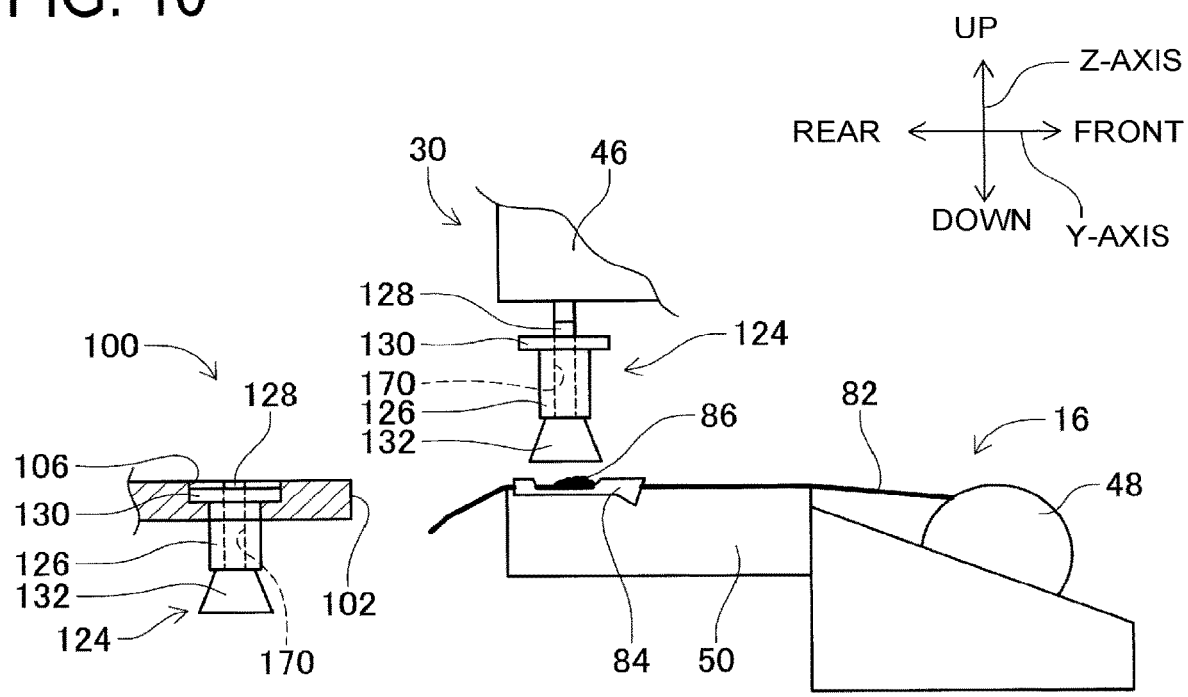
FIG. 10 is a schematic diagram illustrating a fourth maintenance operation of maintenance board 100.

The fourth maintenance operation of maintenance board 100 is an operation of cleaning feeder section 50 of reel component supply device 16 by blowing positive pressure air from air passage 170 in feeder cleaning nozzle 124 or by causing feeder cleaning nozzle 124 to suck negative pressure air through air passage 170, as illustrated in FIG. 10. The fourth maintenance operation of maintenance board 100 is performed while feeder cleaning nozzle 124 is held by nozzle holding section 46 of work head 30.

In reel component supply device 16, tape 82 unwound from reel 48 passes through guide 84 of feeder section 50. When the edge of tape 82 is scraped during its passage, tape wear debris 86 accumulates in guide 84. In the fourth maintenance operation of maintenance board 100, feeder section 50 of reel component supply device 16 is cleaned by blowing off tape wear debris 86 with positive pressure air from feeder cleaning nozzle 124 or by sucking off tape wear debris 86 with negative pressure air from feeder cleaning nozzle 124. In a case where tape wear debris 86 is sucked off, tape wear debris 86 is collected in work head 30 by a cyclone method, a paper pack method, a filter method, or the like.

Figure 11:
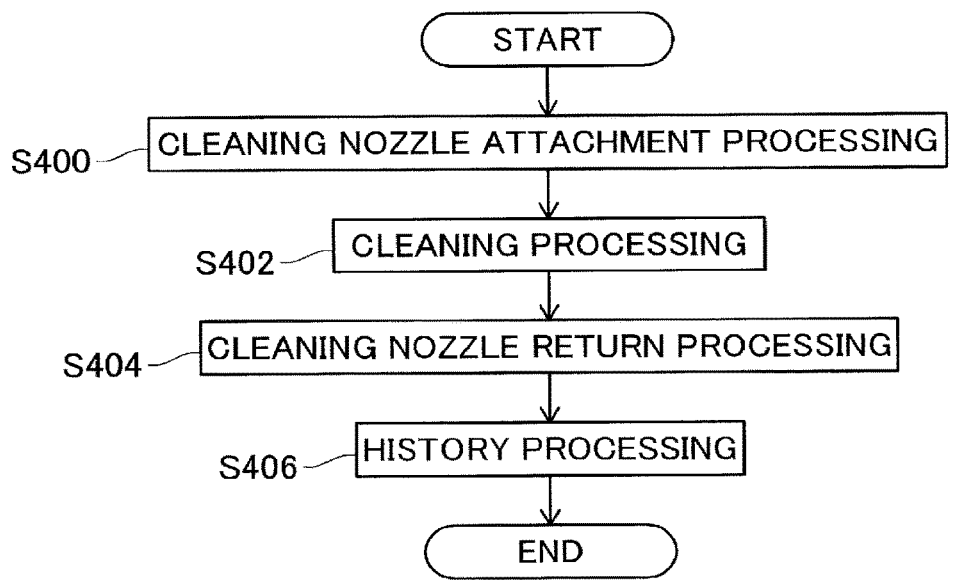
FIG. 11 is a flowchart illustrating the fourth maintenance operation of maintenance board 100.

When the fourth maintenance operation of maintenance board 100 is performed, the process program for achieving the flowchart of FIG. 11 is executed by CPU 52 of control device 20. When the process program is executed, as illustrated in FIG. 11, CPU 52 of control device 20 performs a cleaning nozzle attachment process (step S400). In this process, CPU 52 of control device 20 causes nozzle holding section 46 of work head 30 to hold feeder cleaning nozzle 124 that is in second hole 106 of maintenance board 100. When feeder cleaning nozzle 124 is held by nozzle holding section 46 of work head 30, as described above, air passage 170 of feeder cleaning nozzle 124 communicates with the positive pressure air passage and the negative pressure air passage of work head 30 via positive and negative pressure supply device 66.

Thereafter, CPU 52 of control device 20 performs a cleaning process (step S402). In this process, (nozzle head 132 of) feeder cleaning nozzle 124 is moved by the movement of work head 30 or nozzle holding section 46 so as to be positioned above guide 84 of feeder section 50 of reel component supply device 16 as the cleaning target, and positive and negative pressure supply device 66 is driven to blow positive pressure air through (nozzle head 132 of) feeder cleaning nozzle 124 or suck negative pressure air into (nozzle head 132 of) feeder cleaning nozzle 124. Thus, cleaning of feeder section 50 of reel component supply device 16 is performed by feeder cleaning nozzle 124. In a case where negative pressure air is sucked into feeder cleaning nozzle 124, it is desirable to set the distance from guide 84 of feeder section 50 to nozzle head 132 of feeder cleaning nozzle 124 to a predetermined distance in order to facilitate suction of tape wear debris 86.

In a case where cleaning is performed, CPU 52 of control device 20 performs a cleaning nozzle return process (step S404). In this process, CPU 52 of control device 20 returns feeder cleaning nozzle 124 held by nozzle holding section 46 of work head 30 to second hole 106 of maintenance board 100.

Thereafter, CPU 52 of control device 20 performs history processing (step S406). In this processing, CPU 52 of control device 20 stores a log indicating that feeder section 50 of reel component supply device 16 as the cleaning target has been cleaned in HDD 56 or the like in association with the feeder ID of reel component supply device 16 as the cleaning target. However, the log may be transmitted to maintenance board 100 via communication devices 72, 164 so as to be stored in storage device 160 of maintenance board 100 or stored in the PC or the like connected to component mounting device 10. Thereafter, CPU 52 of control device 20 ends the process program.

As described in detail above, in the fourth maintenance operation of maintenance board 100, since feeder cleaning nozzle 124 of maintenance board 100, which is conveyed by conveyance device 22 during the fourth maintenance operation, is used and it is not necessary to secure a permanent space for feeder cleaning nozzle 124 in component mounting device 10, it is highly cost-effective. Furthermore, by performing the fourth maintenance operation of maintenance board 100, cleaning by an operator can be omitted.

(4-5) Fifth Maintenance Operation of Maintenance Board 100

Figure 12:
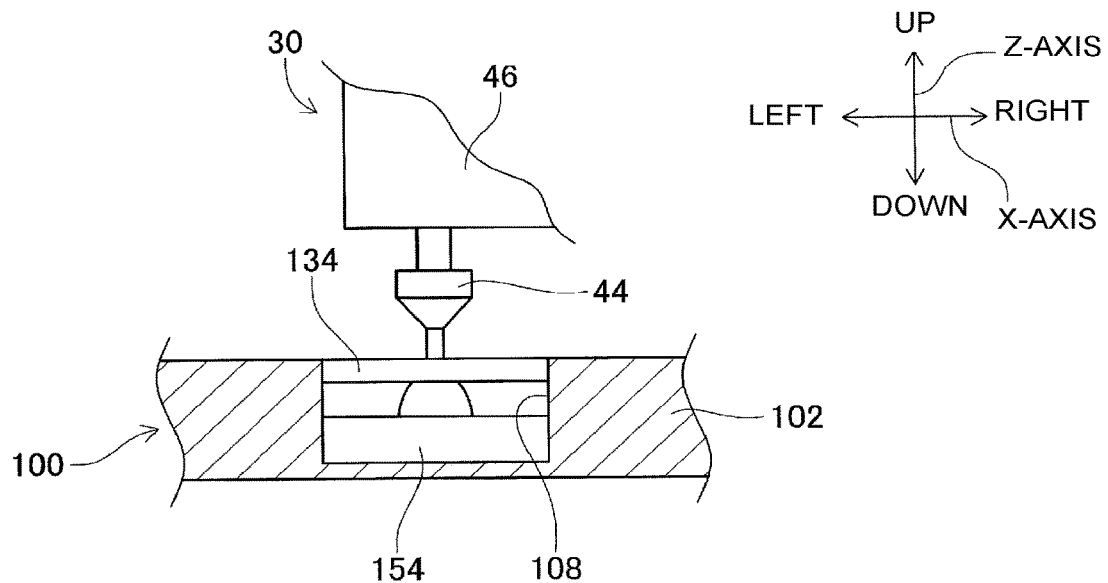
FIG. 12 is a schematic diagram illustrating a fifth maintenance operation of maintenance board 100.

The fifth maintenance operation of maintenance board 100 is an operation of acquiring load data for suction nozzle 44 with load cell 154 in third hole 108 by bringing suction nozzle 44 into contact with spherical seat 134 in third hole 108, as illustrated in FIG. 12.

In work head 30, suction nozzle 44 is configured to be movable relative to nozzle holding section 46 in the Z-direction (i.e., the up-down direction). Therefore, when a component is picked up from reel component supply device 16, even if work head 30 is lowered after suction nozzle 44 is brought into contact with the component, the lowering movement is absorbed by the relative movement of suction nozzle 44 with respect to nozzle holding section 46. Further, when the component is mounted on board S, even if work head 30 is lowered after the component is brought into contact with board S, the lowering movement is absorbed by the relative movement of suction nozzle 44 with respect to nozzle holding section 46. Therefore, in the fifth maintenance operation of maintenance board 100, the sliding resistance at the time of the relative movement of suction nozzle 44 with respect to nozzle holding section 46 is acquired as the load data of suction nozzle 44.

Figure 13:
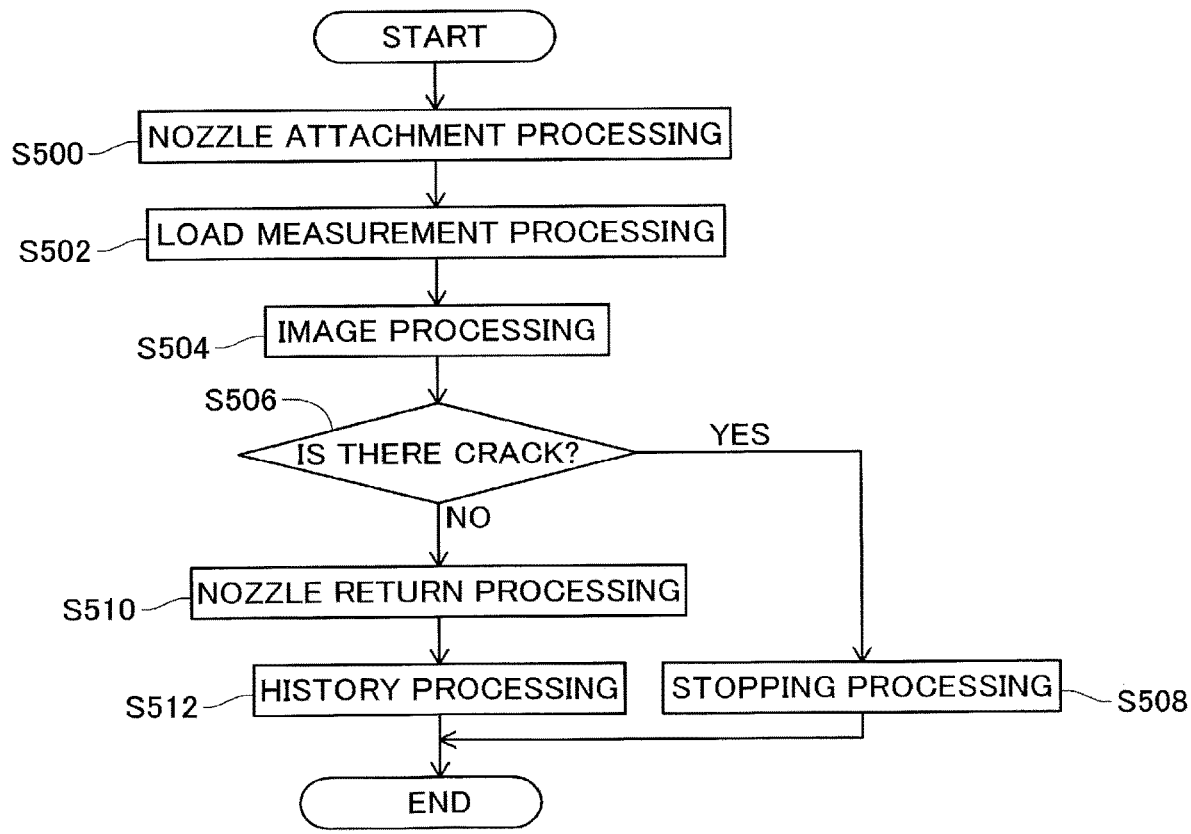
FIG. 13 is a flowchart illustrating the fifth maintenance operation of maintenance board 100.

When the fifth maintenance operation of maintenance board 100 is performed, the process program for achieving the flowchart of FIG. 13 is executed by CPU 52 of control device 20. When the process program is executed, as illustrated in FIG. 13, CPU 52 of control device 20 performs a nozzle attachment process (step S500). In this process, CPU 52 of control device 20 causes nozzle holding section 46 of work head 30 to hold suction nozzle 44 after recognizing the nozzle ID of suction nozzle 44 which will actually be used for component mounting. The recognition of the nozzle ID is performed, for example, by reading a QR code (registered trademark) attached to suction nozzle 44 with mark camera 68 before suction nozzle 44 is held by nozzle holding section 46. CPU 52 of control device 20 may cause nozzle holding section 46 of work head 30 to hold a dedicated load-measurement nozzle after recognizing the nozzle ID of the dedicated load-measurement nozzle.

Thereafter, CPU 52 of control device 20 performs a load measurement process (step S502). In this process, CPU 52 of control device 20 brings suction nozzle 44 into contact with spherical seat 134 by lowering suction nozzle 44 toward spherical seat 134 of maintenance board 100 such that the component is picked up by suction nozzle 44 or the component is mounted by suction nozzle 44. Such contact is performed based on the settings of the production program stored in ROM 54 or the like. Thus, the load data of suction nozzle 44 is acquired by load cell 154, and the sliding operation or the stacking operation of suction nozzle 44 is confirmed. In a case where the load measurement dedicated nozzle is held by nozzle holding section 46 of work head 30, the load measurement dedicated nozzle is brought into contact with spherical seat 134 based on a dedicated measurement program stored in ROM 54 or the like. Thus, the load data of the load measurement dedicated nozzle is acquired by load cell 154.

When the load data is acquired, CPU 52 of control device 20 performs an imaging process (step S504). In this process, suction nozzle 44 or the dedicated load-measurement nozzle (hereinafter referred to as a measurement target nozzle) of which the load data has been acquired is imaged by component camera 18 or side camera 70. Thus, the image data obtained by imaging the measurement target nozzle is acquired.

Thereafter, CPU 52 of control device 20 determines whether there is a crack in the measurement target nozzle (step S506). This determination is performed based on the image data acquired in the process of step S504.

In a case where there is a crack in the measurement target nozzle (step S506: YES), CPU 52 of control device 20 performs a stopping process (step S508). In this process, CPU 52 of control device 20 ends the process program. On the other hand, in a case where there is no crack in the measurement target nozzle (step S506: NO), CPU 52 of control device 20 performs a nozzle return process (step S510). In this process, CPU 52 of control device 20 returns the measurement target nozzle held by nozzle holding section 46 of work head 30 to a nozzle pallet or the like.

Thereafter, CPU 52 of control device 20 performs history processing (step S512). In this processing, CPU 52 of control device 20 acquires the load data from maintenance board 100 via communication devices 72, 164, and stores the load data in HDD 56 or the like in association with the nozzle ID of the measurement target nozzle. The load data may be stored in the PC or the like connected to component mounting device 10 in association with the nozzle ID. On the other hand, the nozzle ID may be transmitted to maintenance board 100 via communication devices 72, 164 so as to be stored in association with the load data in storage device 160 of maintenance board 100. Thereafter, CPU 52 of control device 20 ends the process program.

As described in detail above, in the fifth maintenance operation of maintenance board 100, since load cell 154 of maintenance board 100, which is conveyed by conveyance device 22 during the fifth maintenance operation, is used and it is not necessary to secure a permanent space for load cell 154 in component mounting device 10, it is highly cost-effective. Furthermore, by performing the fifth maintenance operation of maintenance board 100, the load data of the measurement target nozzle can be stored in association with the nozzle ID of the measurement target nozzle.

(4-6) Sixth Maintenance Operation of Maintenance Board 100

Figure 14:
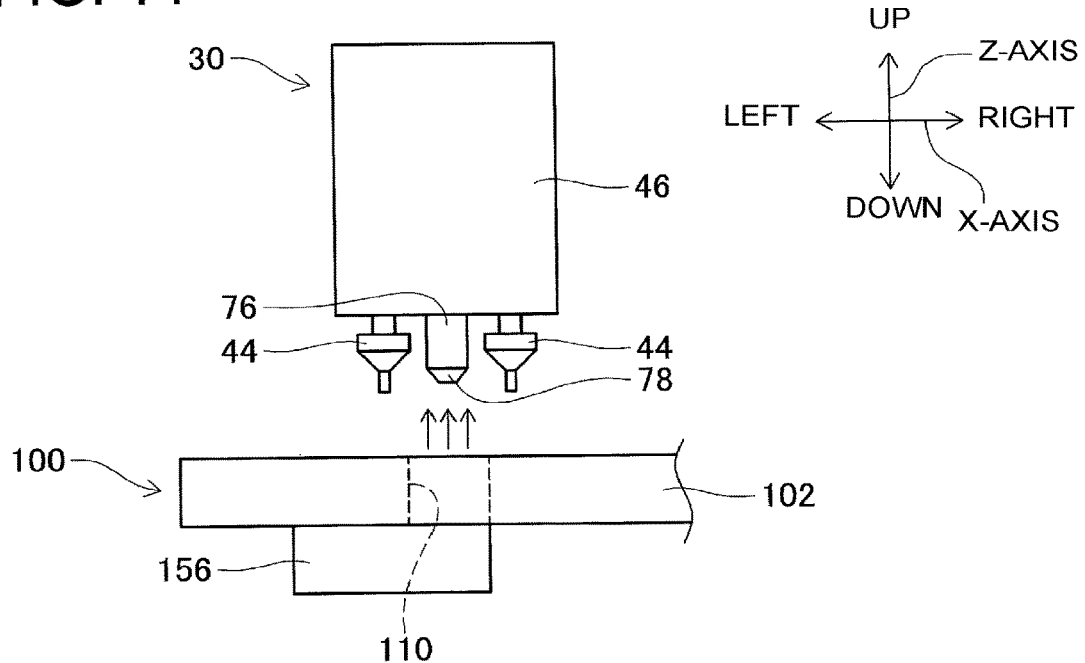
FIG. 14 is a schematic diagram illustrating a sixth maintenance operation of maintenance board 100.

The sixth maintenance operation of maintenance board 100 is an operation of cleaning nozzle holding section 46 of work head 30 with the strong wind of blower 156 blown upward through fourth hole 110, as illustrated in FIG. 14. In a case where suction nozzle 44 is held by nozzle holding section 46, cleaning of suction nozzle 44 is also performed by the sixth maintenance operation of maintenance board 100.

Figure 15:
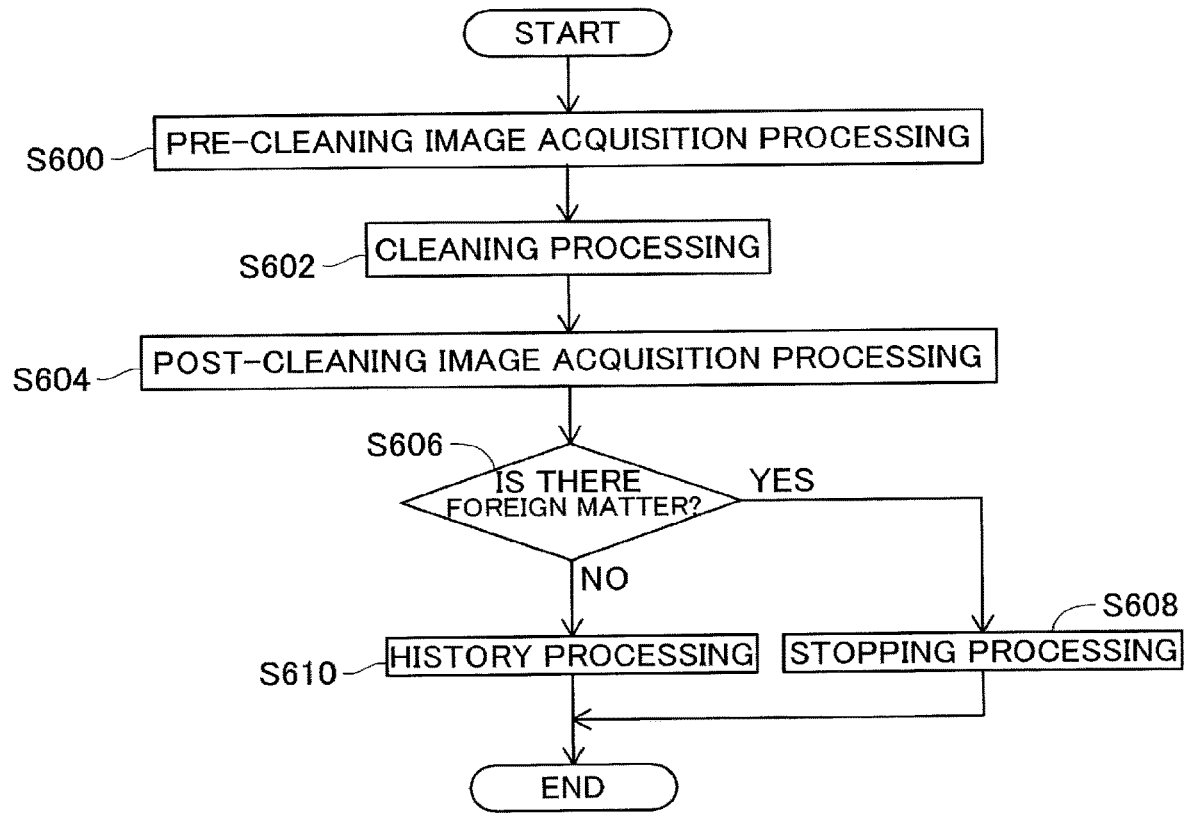
FIG. 15 is a flowchart illustrating the sixth maintenance operation of maintenance board 100.

When the sixth maintenance operation of maintenance board 100 is performed, the process program for achieving the flowchart of FIG. 15 is executed by CPU 52 of control device 20. When the process program is executed, as illustrated in FIG. 15, CPU 52 of control device 20 performs a pre-cleaning image acquisition process (step S600). In this process, nozzle holding section 46 of work head 30 is imaged by component camera 18. Thus, the image data obtained by imaging nozzle holding section 46 of work head 30 before cleaning is acquired.

When the image data is acquired, CPU 52 of control device 20 performs a cleaning process (step S602). In this process, by transmitting a control signal to maintenance board 100 via communication devices 72, 164, CPU 52 of control device 20 drives blower 156. Further, CPU 52 of control device 20 moves work head 30 in the X-direction (i.e., the left-right direction) or the Y-direction (i.e., the front-rear direction) or moves nozzle holding section 46 in the Q-direction (i.e., a rotational direction about an axis parallel to the Z-axis), and thereby causes the entire area of nozzle holding section 46 of work head 30 to pass over fourth hole 110 of maintenance board 100. Therefore, the strong wind of blower 156 blown upward through fourth hole 110 of maintenance board 100 is applied to the entire area of nozzle holding section 46 of work head 30. In this way, cleaning of nozzle holding section 46 of work head 30 is performed by blower 156.

Thereafter, CPU 52 of control device 20 performs a post-cleaning image acquisition process (step S604). In this process, by first transmitting a control signal to maintenance board 100 via communication devices 72, 164, CPU 52 of control device 20 stops blower 156. Further, CPU 52 of control device 20 images nozzle holding section 46 of work head 30 with component camera 18. As a result, the image data obtained by imaging nozzle holding section 46 of work head 30 after cleaning is acquired. The stopping of blower 156 may be performed when the process program is ended.

When the image data is acquired, CPU 52 of control device 20 determines whether there is foreign matter in nozzle holding section 46 of work head 30 (step S606). This determination is performed by comparing and collating the image data before cleaning acquired in the process of step S600 with the image data after cleaning acquired in the process of step S604 in image processing section 74.

Here, if there is foreign matter in nozzle holding section 46 of work head 30 (step S606: YES), CPU 52 of control device 20 performs a stopping process (step S608). In this process, CPU 52 of control device 20 ends the process program. However, in this process, CPU 52 of control device 20 may repeatedly execute the processes from step S600 to step S606. The number of repetitions is limited to a predetermined count number.

On the other hand, if there is no foreign matter in nozzle holding section 46 of work head 30 (step S606: NO), CPU 52 of control device 20 performs history processing (step S610). In this processing, CPU 52 of control device 20 stores the image data acquired in the processes of steps S600 and S604 in HDD 56 or the like. However, the image data may be transmitted to maintenance board 100 via communication devices 72, 164 so as to be stored in storage device 160 of maintenance board 100 or stored in the PC or the like connected to component mounting device 10. Thereafter, CPU 52 of control device 20 ends the process program.

As described in detail above, in the sixth maintenance operation of maintenance board 100, since blower 156 of maintenance board 100, which is conveyed by conveyance device 22 during the sixth maintenance operation, is used and it is not necessary to secure a permanent space for blower 156 in component mounting device 10, it is highly cost-effective. Furthermore, by performing the sixth maintenance operation of maintenance board 100, cleaning by an operator can be omitted.

(4-7) Seventh Maintenance Operation of Maintenance Board 100

Figure 16:
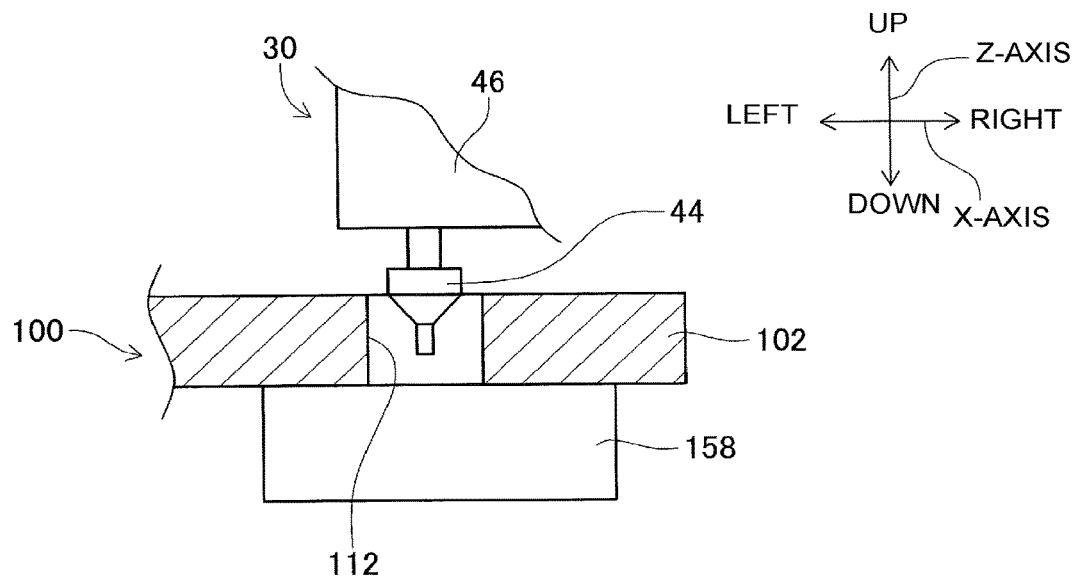
FIG. 16 is a schematic diagram illustrating a seventh maintenance operation of maintenance board 100.

The seventh maintenance operation of maintenance board 100 is an operation of acquiring air pressure data of suction nozzle 44 with transducer 158 connected to the lower opening of fifth hole 112 by inserting suction nozzle 44 into fifth hole 112 through the upper opening of fifth hole 112, as illustrated in FIG. 16.

Suction nozzle 44 picks up a component by suction with negative pressure when picking up of the component and releases the component with a small amount of positive pressure when mounting the component. Thus, in the seventh maintenance operation of maintenance board 100, the negative pressure data and the positive pressure data of suction nozzle 44 are acquired as air pressure data of suction nozzle 44.

Figure 17:
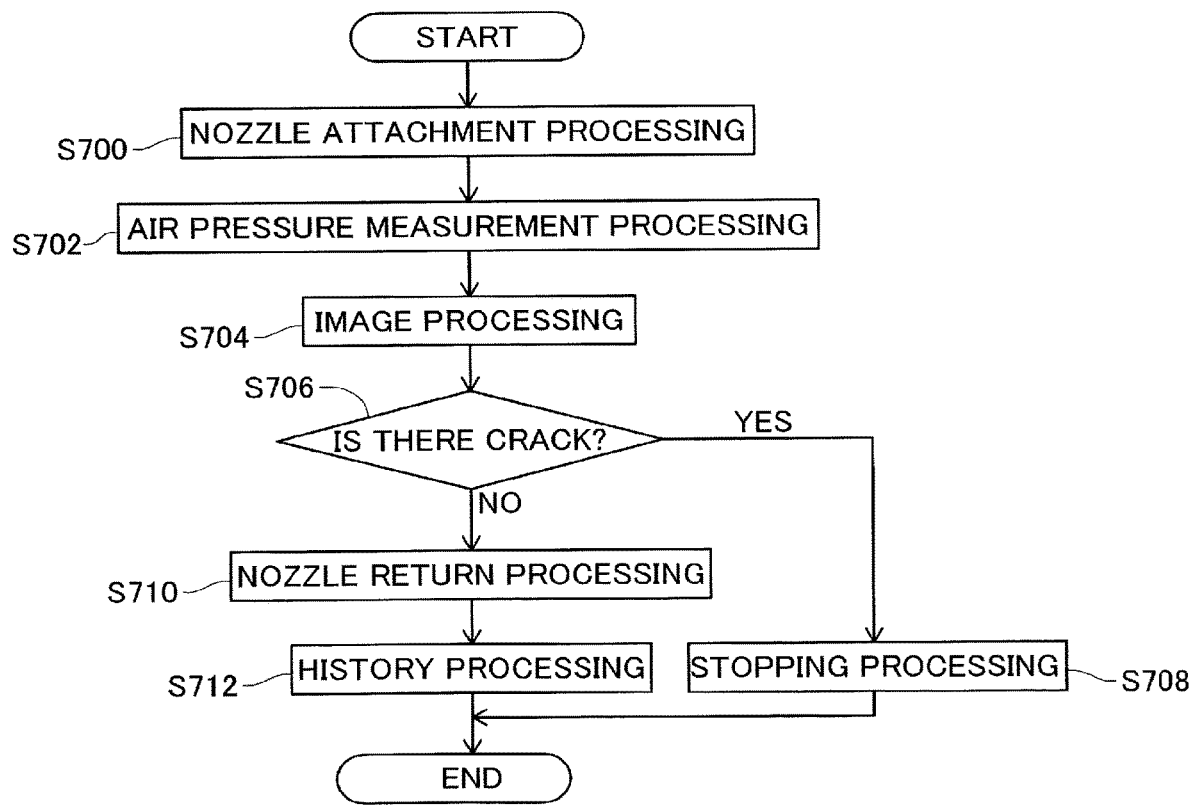
FIG. 17 is a flowchart illustrating the seventh maintenance operation of maintenance board 100.

When the seventh maintenance operation of maintenance board 100 is performed, the process program for achieving the flowchart of FIG. 17 is executed by CPU 52 of control device 20. When the process program is executed, as illustrated in FIG. 17, CPU 52 of control device 20 performs a nozzle attachment process (step S700). In this process, CPU 52 of control device 20 causes nozzle holding section 46 of work head 30 to hold suction nozzle 44 after recognizing the nozzle ID of suction nozzle 44 which will actually be used for component mounting. When suction nozzle 44 is held by nozzle holding section 46 of work head 30, as described above, suction nozzle 44 communicates with the negative pressure air passage and the positive pressure air passage of work head 30 via positive and negative pressure supply device 66. The recognition of the nozzle ID is performed, for example, in the same manner as in the fifth maintenance operation of maintenance board 100 described above.

Thereafter, CPU 52 of control device 20 performs an air pressure measurement process (step S702). In this process, CPU 52 of control device 20 lowers suction nozzle 44 toward fifth hole 112 of maintenance board 100 to cause suction nozzle 44 to be inserted into fifth hole 112, bringing suction nozzle 44 into close contact with transducer 158. Further, CPU 52 of control device 20 drives positive and negative pressure supply device 66 to blow positive pressure air from suction nozzle 44 or suck negative pressure air into suction nozzle 44. As a result, air pressure data of suction nozzle 44 is acquired by transducer 158.

When the air pressure data is acquired, CPU 52 of control device 20 performs an imaging process (step S704). In this process, suction nozzle 44 of which the air pressure data has been acquired (hereinafter, referred to as measurement target nozzle) is imaged by component camera 18 or side camera 70. Thus, the image data obtained by imaging the measurement target nozzle is acquired.

Thereafter, CPU 52 of control device 20 determines whether there is a crack in the measurement target nozzle (step S706). This determination is performed based on the image data acquired in the processing of step S704.

Here, in a case where there is a crack in the measurement target nozzle (step S706: YES), CPU 52 of control device 20 performs a stopping process (step S708). In this process, CPU 52 of control device 20 ends the process program. On the other hand, in a case where there is no crack in the measurement target nozzle (step S706: NO), CPU 52 of control device 20 performs a nozzle return process (step S710). In this process, CPU 52 of control device 20 returns the measurement target nozzle held by nozzle holding section 46 of work head 30 to the nozzle pallet or the like.

Thereafter, CPU 52 of control device 20 performs history processing (step S712). In this processing, CPU 52 of control device 20 acquires the air pressure data from maintenance board 100 via communication devices 72, 164, and stores the air pressure data in HDD 56 or the like in association with the nozzle ID of the measurement target nozzle. The air pressure data may be stored in the PC or the like connected to component mounting device 10 in association with the nozzle ID. On the other hand, the nozzle ID may be transmitted to maintenance board 100 via communication devices 72, 164 so as to be stored in association with the air pressure data in storage device 160 of maintenance board 100. Thereafter, CPU 52 of control device 20 ends the process program.

As described in detail above, in the seventh maintenance operation of maintenance board 100, since transducer 158 of maintenance board 100, which is conveyed by conveyance device 22 during the seventh maintenance operation, is used and it is not necessary to secure a permanent space for transducer 158 in component mounting device 10, it is highly cost-effective. Furthermore, by performing the seventh maintenance operation of maintenance board 100, the air pressure data of the measurement target nozzle can be stored in association with the nozzle ID of the measurement target nozzle.

In the seventh maintenance operation of maintenance board 100, the air pressure data is acquired in the same manner as suction nozzle 44 even in a case where, instead of suction nozzle 44, a nozzle of which the air pressure data is desired to be acquired is held by nozzle holding section 46 of work head 30.

(4-8) Eighth Maintenance Operation of Maintenance Board 100

Figure 18:
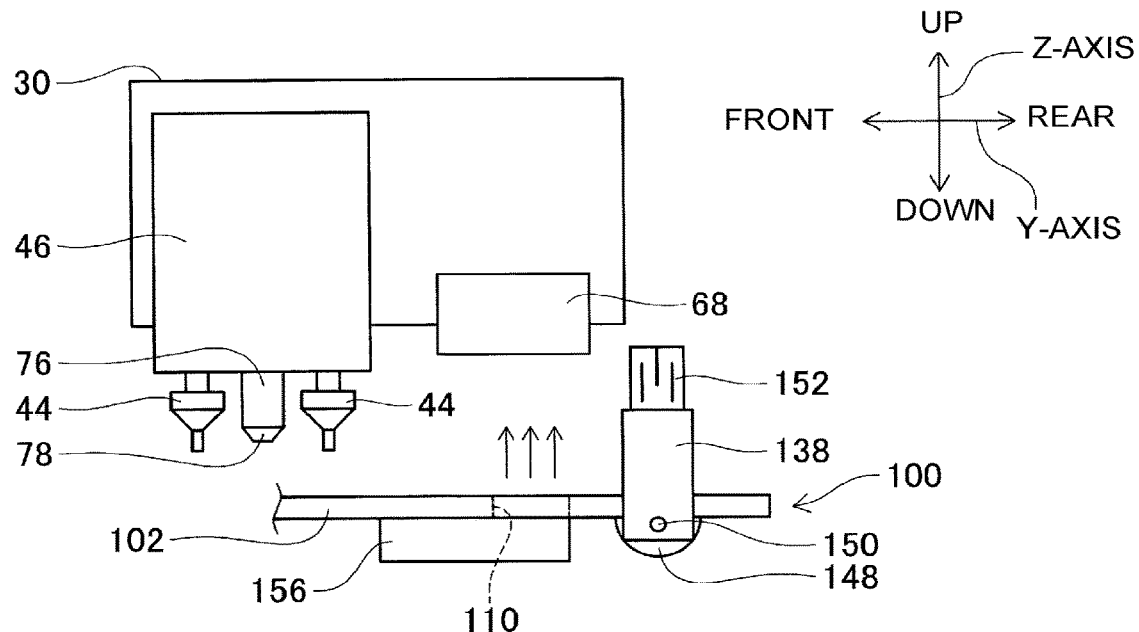
FIG. 18 is a schematic diagram illustrating an eighth maintenance operation of maintenance board 100.

The eighth maintenance operation of maintenance board 100 is an operation of cleaning mark camera 68 by brushing mark camera 68 with third brush 152 of second arm section 138 and blowing strong wind of blower 156 upward through fourth hole 110 toward mark camera 68, as illustrated in FIG. 18. In the eighth maintenance operation of maintenance board 100, second arm section 138 is in an erected state. Accordingly, third brush 152 faces upward while being separated from board main body 102, and mark camera 68 is moved into third brush 152 facing upward.

Figure 19:
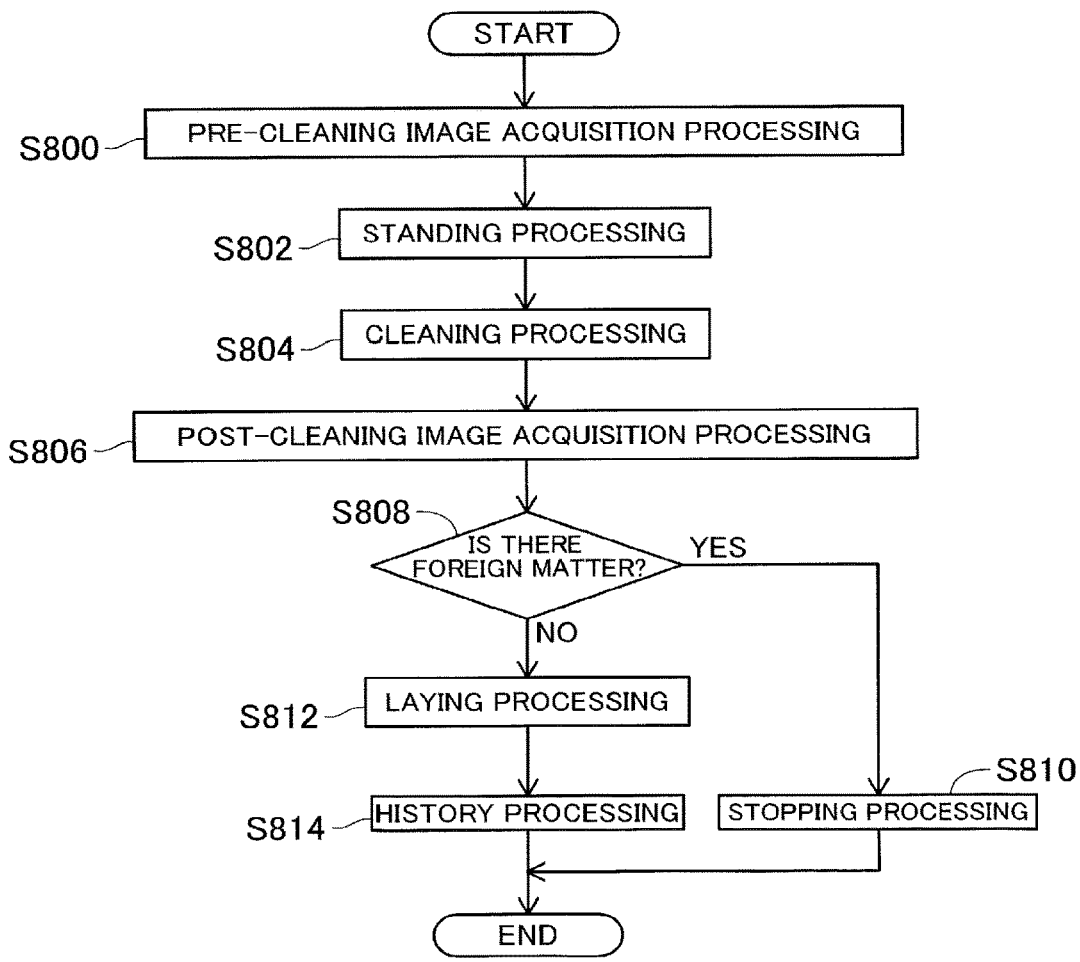
FIG. 19 is a flowchart illustrating the eighth maintenance operation of maintenance board 100.

When the eighth maintenance operation of maintenance board 100 is performed, the process program for implementing the flowchart of FIG. 19 is executed by CPU 52 of control device 20. When the process program is executed, as illustrated in FIG. 19, CPU 52 of control device 20 performs a pre-cleaning image acquisition process (step S800). In this process, imaging by mark camera 68 is performed. As a result, image data before cleaning obtained by mark camera 68 is acquired.

When the image data is acquired, CPU 52 of control device 20 performs an erecting process (step S802). In this process, by transmitting a control signal to maintenance board 100 via communication devices 72, 164, CPU 52 of control device 20 drives second motor 148 to put second arm section 138 in an erected state.

When second arm section 138 is in the erected state, CPU 52 of control device 20 performs a cleaning process (step S804). In this process, mark camera 68 is moved into third brush 152 so that mark camera 68 is cleaned with third brush 152. The movement of mark camera 68 is performed by moving work head 30 in the X-direction (left-right direction) or the Y-direction (front-rear direction). Further, by transmitting a control signal to maintenance board 100 via communication devices 72, 164, CPU 52 of control device 20 drives blower 156. Further, CPU 52 of control device 20 moves work head 30 in the X-direction (left-right direction) or the Y-direction (front-rear direction), and thereby causes the entire area of mark camera 68 to pass over the fourth hole 110 of maintenance board 100. The strong wind of blower 156 is blown upward through fourth hole 110 of maintenance board 100. Therefore, the strong wind of blower 156 is applied to the entire area of mark camera 68. In this way, cleaning of mark camera 68 is performed by blower 156.

When cleaning is performed, CPU 52 of control device 20 performs a post-cleaning image acquisition process (step S806). In this process, by first transmitting a control signal to maintenance board 100 via communication devices 72, 164, CPU 52 of control device 20 stops blower 156. Further, CPU 52 of control device 20 performs imaging with mark camera 68. As a result, image data after cleaning obtained by mark camera 68 is acquired. The stopping of blower 156 may be performed when the process program is ended.

When the image data is acquired, CPU 52 of control device 20 determines whether there is foreign matter in mark camera 68 (step S808). This determination is performed by comparing and collating the image data before cleaning acquired in the process of step S800 with the image data after cleaning acquired in the process of step S806 in image processing section 74.

Here, in a case where there is foreign matter in mark camera 68 (step S808: YES), CPU 52 of control device 20 performs a stopping process (step S810). In this process, CPU 52 of control device 20 ends the process program. However, in this process, CPU 52 of control device 20 may repeatedly execute the processes from step S800 to step S808. The number of repetitions is limited to a predetermined count number.

On the other hand, in a case where there is no foreign matter in mark camera 68 (step S808: NO), CPU 52 of control device 20 performs a collapsing process (step S812). In this process, by transmitting a control signal to maintenance board 100 via communication devices 72, 164, CPU 52 of control device 20 drives second motor 148 to put second arm section 138 in a collapsed state.

When second arm section 138 is in the collapsed state, CPU 52 of control device 20 performs history processing (step S814). In this processing, CPU 52 of control device 20 stores the image data acquired in the processes of steps S800 and S806 in HDD 56 or the like. However, the image data may be transmitted to maintenance board 100 via communication devices 72, 164 so as to be stored in storage device 160 of maintenance board 100 or stored in the PC or the like connected to component mounting device 10. Thereafter, CPU 52 of control device 20 ends the process program.

As described in detail above, in the eighth maintenance operation of maintenance board 100, since third brush 152 and blower 156 of maintenance board 100, which are conveyed by conveyance device 22 during the eighth maintenance operation, are used and it is not necessary to secure a permanent space for third brush 152 and blower 156 in component mounting device 10, it is highly cost-effective. Further, by performing the eighth maintenance operation of maintenance board 100, it is possible to clean mark camera 68 with both strong wind and brushing, and cleaning by an operator can be omitted.

(5) Summary

As described above in detail, maintenance board 100 can be used for a maintenance process other than removing static electricity from component mounting device 10 by being conveyed by conveyance device 22 of component mounting device 10. Further, in each maintenance operation of maintenance board 100, history processing (steps S114, S216, S314, S406, S512, S610, S712, S814) is performed, thereby making it possible to establish traceability capable of automatically acquiring cleaning records or various data.

Incidentally, in the present embodiment, lens cleaning nozzle 114 and feeder cleaning nozzle 124 are examples of a cleaning nozzle. First arm section 136 and second arm section 138 are examples of an arm section. First brush 144, second brush 146, and third brush 152 are examples of a brush. Transducer 158 is an example of a first pressure sensor. Load cell 154 is an example of a second pressure sensor.

(6) Other

It should be noted that the present disclosure is not limited to the above-mentioned embodiments, and various modifications can be made without departing from the spirit thereof. For example, regarding suction nozzle 44 for picking up or releasing the component, the present disclosure is not particularly limited thereto, and may adopt a mechanical chuck, for example. In such a case, the first maintenance operation of maintenance board 100, the fifth maintenance operation of maintenance board 100, or the sixth maintenance operation of maintenance board 100 is applied.

In addition, if a button provided on maintenance board 100 is configured to be pressed by work head 30 or the like, a control signal for starting maintenance, ending maintenance, or stopping maintenance can be inputted to maintenance board 100 by pressing the button, making it possible to omit communication devices 72, 164.

REFERENCE SIGNS LIST 10 component mounting device, 18 component camera, 22 conveyance device, 30 work head, 46 nozzle holding section, 44 suction nozzle, 68 mark camera, 70 side camera, 80 reflective body, 84 guide, 100 maintenance board, 114 lens cleaning nozzle, 124 feeder cleaning nozzle, 136 first arm section, 138 second arm section, 144 first brush, 146 second brush, 152 third brush, 154 load cell, 156 blower, 158 transducer, 164 communication device, S board, L1 width of maintenance board, L2 distance from pivot point of first arm section to first and second brushes, L3 distance from pivot point of second arm section to third brush

The invention claimed is:

1. A maintenance board operatively associated with a conveyance device of a component mounting device, the maintenance board comprising:
    a board main body;
    a brush configured to brush a maintenance target object, the brush being disposed on an arm section;
    a cleaning nozzle configured to be held in an attachable manner to a work head of the component mounting device and to blow air to the maintenance target object, the cleaning nozzle being disposed in a first hole in the board main body;
    a first pressure sensor configured to measure positive pressure of air blown from a suction nozzle attached to the work head or a negative pressure of air sucked into the suction nozzle, the first pressure sensor being disposed in a second hole in the board main body;
    a second pressure sensor configured to measure a mounting load of a component on a board by the suction nozzle attached to the work head, the second pressure sensor being disposed in a third hole in the board main body; and
    a blower configured to blow air toward the work head, the blower being disposed on a lower face of the board main body.

2. The maintenance board of claim 1, wherein the brush stands upright facing upward from the maintenance board.

3. The maintenance board of claim 1,
    wherein the arm section is configured to be an elongated member with a first end, which is one end of the elongated member, pivotally supported in a rotatable manner by the maintenance board, the arm section being capable of shifting between a collapsed state and an erected state with respect to the maintenance board;
    wherein the brush stands upright, at a second end, which is an end on an opposite side from the first end of the arm section, of at least one face among an end face of the arm section in the longitudinal direction and two side faces that are opposite to each other in the traverse direction; and
    wherein a distance from a pivot point of the arm section to the brush is equal to a distance from the maintenance board to the maintenance target object.

4. The maintenance board of claim 1, wherein the maintenance board further comprises a communication device configured to transmit a maintenance history.

* * * * *